United States Patent
Yoon

(10) Patent No.: US 10,720,192 B2
(45) Date of Patent: Jul. 21, 2020

(54) SEMICONDUCTOR DEVICE CONFIGURED TO GENERATE A STROBE SIGNAL HAVING VARIOUS PATTERNS

(71) Applicant: SK hynix Inc., Icheon-si, Gyeonggi-do (KR)

(72) Inventor: Young Jun Yoon, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 16/200,273

(22) Filed: Nov. 26, 2018

(65) Prior Publication Data

US 2020/0020368 A1    Jan. 16, 2020

(30) Foreign Application Priority Data

Jul. 13, 2018    (KR) .................... 10-2018-0081931

(51) Int. Cl.
*G11C 7/10*    (2006.01)
*G11C 7/22*    (2006.01)

(52) U.S. Cl.
CPC ............ *G11C 7/1066* (2013.01); *G11C 7/222* (2013.01)

(58) Field of Classification Search
CPC ..... G11C 7/1066; G11C 7/22; G11C 11/4076; G11C 7/222; G11C 11/4096; G11C 7/1051
See application file for complete search history.

(56) References Cited

U.S. PATENT DOCUMENTS

| | | | |
|---|---|---|---|
| 2010/0172196 A1* | 7/2010 | Na | G11C 7/1051 365/193 |
| 2011/0047319 A1* | 2/2011 | Jeon | G06F 13/4243 711/103 |
| 2013/0215691 A1 | 8/2013 | Koshizuka | |

FOREIGN PATENT DOCUMENTS

KR        1020070119378 A        12/2007

* cited by examiner

*Primary Examiner* — David Lam
(74) *Attorney, Agent, or Firm* — William Park & Associates Ltd.

(57) ABSTRACT

A semiconductor device includes a strobe signal generation circuit. The strobe signal generation circuit generates a strobe signal which is toggled in synchronization with a multiplication clock signal during enablement periods of a toggling drive signal and a down drive signal. A postamble period is set according to the toggling drive signal and the down drive signal.

42 Claims, 16 Drawing Sheets

FIG. 7

| PREAMBLE PERIOD | OP<2> | OP<1> | SEL<1> | SEL<2> | SEL<3> | SEL<4> |
|---|---|---|---|---|---|---|
| FIRST PATTERN | L | L | L | H | L | L |
| SECOND PATTERN | L | H | L | L | L | L |
| THIRD PATTERN | H | L | H | L | L | L |
| FOURTH PATTERN | H | H | H | L | L | L |

FIG. 8

| POSTAMBLE PERIOD | OP<5> | OP<4> | OP<3> | SEL<5> | SEL<6> |
|---|---|---|---|---|---|
| FIFTH PATTERN | L | L | L | L | L |
| SIXTH PATTERN | L | L | H | H | L |
| SEVENTH PATTERN | L | H | L | L | H |
| EIGHTH PATTERN | H | L | L | L | L |
| NINTH PATTERN | H | L | H | L | L |
| TENTH PATTERN | H | H | L | L | L |

SEMICONDUCTOR DEVICE CONFIGURED TO GENERATE A STROBE SIGNAL HAVING VARIOUS PATTERNS

CROSS-REFERENCE TO RELATED APPLICATIONS

The present application claims priority under 35 U.S.C 119(a) to Korean Application No. 10-2018-0081931, filed on Jul. 13, 2018, which is incorporated herein by reference in its entirety.

BACKGROUND

1. Technical Field

Embodiments of the present disclosure generally relate to semiconductor devices receiving or outputting data in synchronization with a strobe signal.

2. Related Art

Semiconductor devices have been continuously developed to improve an operation speed with increase of the integration density thereof. Synchronous semiconductor devices synchronized with an external clock signal for operation have been proposed to improve the operation speed.

The semiconductor devices may perform operations for aligning and receiving or outputting data according to a strobe signal for strobing the data.

SUMMARY

According to an embodiment, a semiconductor device includes a period signal generation circuit, a synchronization circuit and a strobe signal generation circuit. The period signal generation circuit generates a toggling period signal and a down period signal whose enablement periods are controlled according to operation codes in response to a read post signal. The synchronization circuit is synchronized with a first multiplication clock signal and a second multiplication clock signal to generate a first toggling drive signal and a second toggling drive signal from the toggling period signal. In addition, the synchronization circuit is synchronized with the first and second multiplication clock signals to generate a first down drive signal and a second down drive signal from the down period signal. The strobe signal generation circuit sets a postamble period and a normal period in response to the first and second toggling drive signals and the first and second down drive signals. The strobe signal generation circuit generates a strobe signal which is toggled during the normal period.

According to an embodiment, a semiconductor device includes a synchronization circuit, a strobe signal generation circuit and a data output circuit. The synchronization circuit is synchronized with a first multiplication clock signal and a second multiplication clock signal to generate a first toggling drive signal and a second toggling drive signal from a toggling period signal. In addition, the synchronization circuit is synchronized with the first and second multiplication clock signals to generate a first down drive signal and a second down drive signal from a down period signal. The strobe signal generation circuit sets a postamble period and a normal period in response to the first and second toggling drive signals and the first and second down drive signals. Moreover, the strobe signal generation circuit generates a strobe signal which is toggled during the normal period. The data output circuit is synchronized with the strobe signal during the normal period to output input data as output data.

According to an embodiment, a semiconductor device includes a drive signal generation circuit and a strobe signal generation circuit. The drive signal generation circuit generates a toggling drive signal and a down drive signal whose enablement periods are controlled according to operation codes. The strobe signal generation circuit generates a strobe signal which is toggled in synchronization with a multiplication clock signal during the enablement periods of the toggling drive signal and the down drive signal. A postamble period is set according to the toggling drive signal and the down drive signal, and various patterns of the strobe signal are generated in the postamble period.

According to an embodiment, a semiconductor device includes a drive signal generation circuit and a strobe signal generation circuit. The drive signal generation circuit generates a toggling drive signal and a down drive signal whose enablement periods are controlled according to operation codes. The strobe signal generation circuit generates a strobe signal which is toggled in synchronization with a multiplication clock signal during the enablement periods of the toggling drive signal and the down drive signal. The strobe signal is toggled or fixed to have a predetermined level during the enablement periods of the toggling drive signal and the down drive signal.

According to an embodiment, a semiconductor device includes a strobe signal generation circuit configured to set a postamble period and a normal period in response to first and second toggling drive signals and first and second down drive signals and configured to generate a strobe signal which is toggled during the normal period. The postamble period of the strobe signal may be set based on the read post signal.

BRIEF DESCRIPTION OF THE DRAWINGS

FIG. 7 is a table illustrating logic level combinations of an operation code and a selection signal for setting various patterns of a preamble period in the present disclosure.

FIG. 8 is a table illustrating logic level combinations of an operation code and a selection signal for setting various patterns of a postamble period in the present disclosure.

DETAILED DESCRIPTION

Various embodiments of the present disclosure will be described hereinafter with reference to the accompanying drawings. However, the embodiments described herein are for illustrative purposes only and are not intended to limit the scope of the present disclosure.

In some embodiments, the semiconductor devices may set a preamble period before the strobe signal is toggled and a postamble period after the strobe signal is toggled, thereby stably generating the strobe signal.

Figure 1:
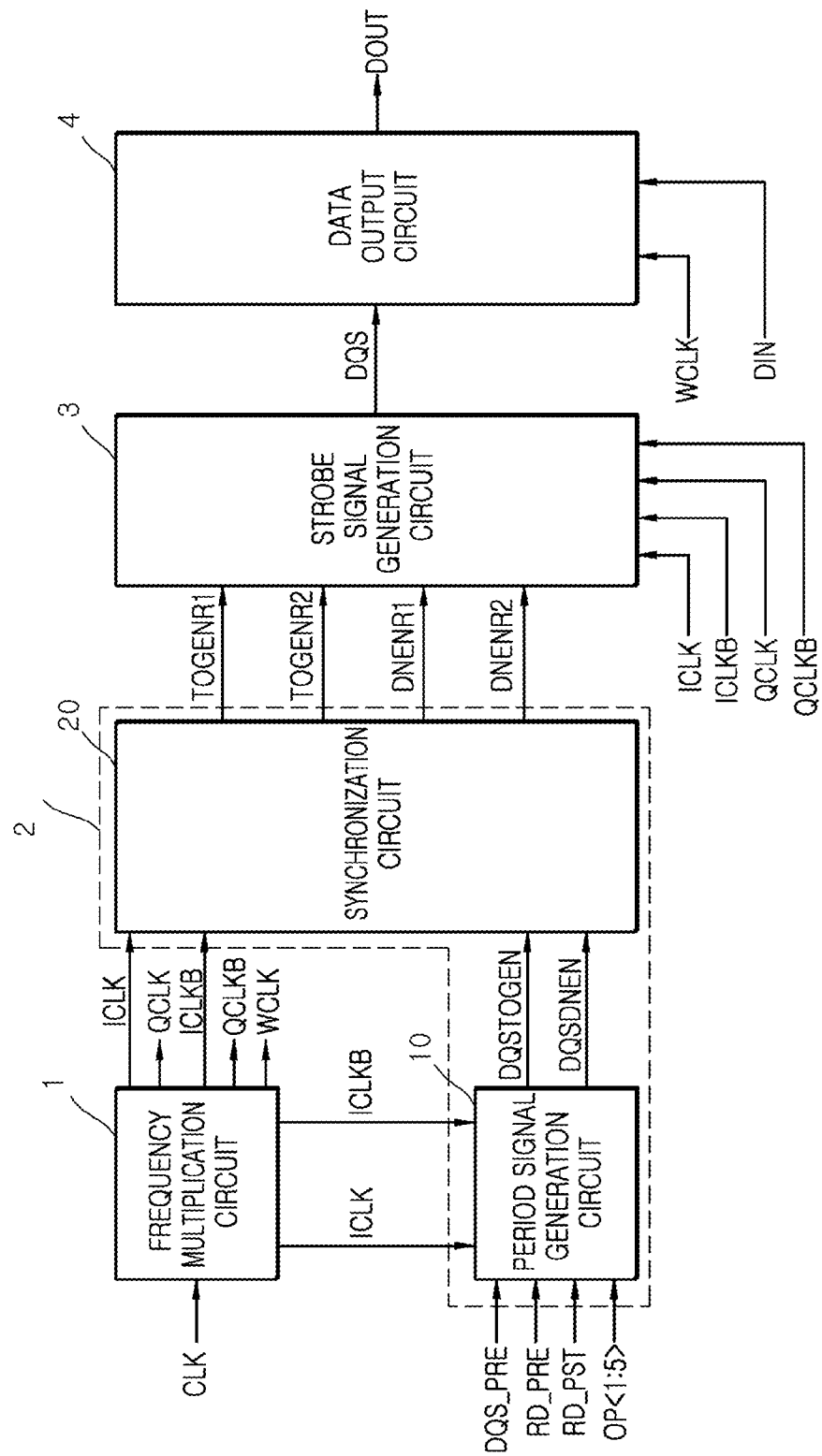
FIG. 1 is a block diagram illustrating a configuration of a semiconductor device according to an embodiment of the present disclosure.

As illustrated in FIG. 1, a semiconductor device according to an embodiment may include a frequency multiplication circuit 1, a drive signal generation circuit 2, a strobe signal generation circuit 3 and a data output circuit 4.

The frequency multiplication circuit 1 may multiply a frequency of an external clock signal CLK by two or more to generate a first multiplication clock signal ICLK, a second multiplication clock signal QCLK, a third multiplication clock signal ICLKB, a fourth multiplication clock signal QCLKB and an internal clock signal WCLK. The frequency multiplication circuit 1 may increase the frequency of the external clock signal CLK to generate the first multiplication clock signal ICLK, the second multiplication clock signal QCLK, the third multiplication clock signal ICLKB and the fourth multiplication clock signal QCLKB having higher frequency than the external clock signal CLK. In an embodiment, the first multiplication clock signal ICLK, the second multiplication clock signal QCLK, the third multiplication clock signal ICLKB and the fourth multiplication clock signal QCLKB may be generated to have different phases. The external clock signal CLK may be a signal that is provided by an external device. The external clock signal CLK may be a toggling signal with which the semiconductor device is synchronized. The first to fourth multiplication clock signals ICLK, QCLK, ICLKB and QCLKB may be generated to have a frequency which is twice a frequency of the external clock signal CLK. The internal clock signal WCLK may be generated to have a frequency which is twice a frequency of the first to fourth multiplication clock signals ICLK, QCLK, ICLKB and QCLKB. The first to fourth multiplication clock signals ICLK, QCLK, ICLKB and QCLKB may be generated to have a phase difference of 90 degrees therebetween.

The drive signal generation circuit 2 may include a period signal generation circuit 10 and a synchronization circuit 20.

The period signal generation circuit 10 may be synchronized with the first and third multiplication clock signals ICLK and ICLKB to generate a toggling period signal DQSTOGEN and a down period signal DQSDNEN from a pre-strobe signal DQS_PRE, a read pre-signal RD_PRE and a read post signal RD_PST. The period signal generation circuit 10 may generate the toggling period signal DQSTOGEN and the down period signal DQSDNEN whose enablement periods are controlled according to first to fifth operation codes OP<1:5> in response to the pre-strobe signal DQS_PRE, the read pre-signal RD_PRE and the read post signal RD_PST. The pre-strobe signal DQS_PRE may be a signal for setting a first preamble period of a strobe signal DQS. The pre-strobe signal DQS_PRE may be set as a signal which is enabled earlier than a starting point of time of a normal period (i.e., a point of time that output data DOUT are outputted from the semiconductor device) by a first set period. The first set period may be set to be equal to "N1" times a cycle of the internal clock signal WCLK (wherein, "N1" denotes a natural number). For example, the first set period may be set to be equal to eight times a cycle of the internal clock signal WCLK. The read pre-signal RD_PRE may be a signal for setting a second preamble period of the strobe signal DQS. The read pre-signal RD_PRE may be set as a signal which is enabled earlier than a starting point of time of the normal period (i.e., a point of time that the output data DOUT are outputted from the semiconductor device) by a second set period. The second set period may be set to be equal to "N2" times a cycle of the internal clock signal WCLK (wherein, "N2" denotes a natural number). For example, the second set period may be set to be equal to six times a cycle of the internal clock signal WCLK. The read post signal RD_PST may be a signal for setting a postamble period of the strobe signal DQS. The read post-signal RD_PST may be set as a signal which is enabled after a third set period from a starting point of time of the normal period (i.e., a point of time that the output data DOUT are outputted from the semiconductor device). The third set period may be set to be equal to "N3" times a cycle of the internal clock signal WCLK (wherein, "N3" denotes a natural number). For example, the third set period may be set to be equal to four times a cycle of the internal clock signal WCLK. The first to fifth operation codes OP<1:5> may be signals which are set by a mode register set (MRS) to set various patterns of the strobe signal DQS during the preamble period and the postamble period. The first to fifth operation codes OP<1:5> may be signals that are provided by an external device to set various patterns of the strobe signal DQS during the preamble period and the postamble period. Although FIG. 1 illustrates an example in which the number of bits included in the operation codes OP<1:5> is five, the number of bits included in the operation codes OP<1:5> may be set differently according to the embodiments. The preamble period may include the first preamble period and the second preamble period. In the preamble period, the strobe signal DQS may be set to have four patterns according to the first to fifth operation codes OP<1:5>. In the postamble period, the strobe signal DQS may be set to have six patterns according to the first to fifth operation codes OP<1:5>. In each of the preamble period and the postamble period, the number of the patterns of the strobe signal DQS may be set to be different according to the embodiments.

The synchronization circuit 20 may be synchronized with the first multiplication clock signal ICLK and the third multiplication clock signal ICLKB to generate a first toggling drive signal TOGENR1 and a second toggling drive signal TOGENR2 from the toggling period signal DQSTOGEN. The synchronization circuit 20 may be synchronized with the first multiplication clock signal ICLK and the third multiplication clock signal ICLKB to generate a first down drive signal DNENR1 and a second down drive signal DNENR2 from the down period signal DQSDNEN. The synchronization circuit 20 may be synchronized with a rising edge of the first multiplication clock signal ICLK to generate the first toggling drive signal TOGENR1 from the toggling period signal DQSTOGEN. The synchronization circuit 20 may be synchronized with a rising edge of the third multiplication clock signal ICLKB to generate the second toggling drive signal TOGENR2 from the toggling period signal DQSTOGEN. The synchronization circuit 20 may be synchronized with a rising edge of the first multiplication clock signal ICLK to generate the first down drive signal DNENR1 from the down period signal DQSDNEN. The synchronization circuit 20 may be synchronized with a rising edge of the third multiplication clock signal ICLKB to generate the second down drive signal DNENR2 from the down period signal DQSDNEN.

Enablement periods of the first and second toggling drive signals TOGENR1 and TOGENR2 and the first and second down drive signals DNENR1 and DNENR2 may be controlled according to a logic level combination of the first to fifth operation codes OP<1:5>.

The strobe signal generation circuit 3 may set the first and second preamble periods, the postamble period and the normal period in response to the first and second toggling drive signals TOGENR1 and TOGENR2 and the first and second down drive signals DNENR1 and DNENR2 and may generate the strobe signal DQS which is toggled during the normal period. The strobe signal generation circuit 3 may generate the strobe signal DQS that is toggled by the first to fourth multiplication clock signals ICLK, QCLK, ICLKB and QCLKB in response to the first and second toggling drive signals TOGENR1 and TOGENR2 and the first and second down drive signals DNENR1 and DNENR2. The strobe signal DQS may be toggled or fixed to have a predetermined level during enablement periods of the first and second toggling drive signals TOGENR1 and TOGENR2 and the first and second down drive signals DNENR1 and DNENR2. The predetermined level of the strobe signal DQS may be set as a logic "high" level or a logic "low" level according to the embodiments.

The data output circuit 4 may be synchronized with the strobe signal DQS during the normal period to output input data DIN as the output data DOUT. The data output circuit 4 may be synchronized with the internal clock signal WCLK to output the output data DOUT. Although the input data DIN is illustrated using a single line and the output data DOUT is illustrated using a single line, the number of bits included in the input data DIN or the output data DOUT may be two or more according to the embodiments.

Figure 2:
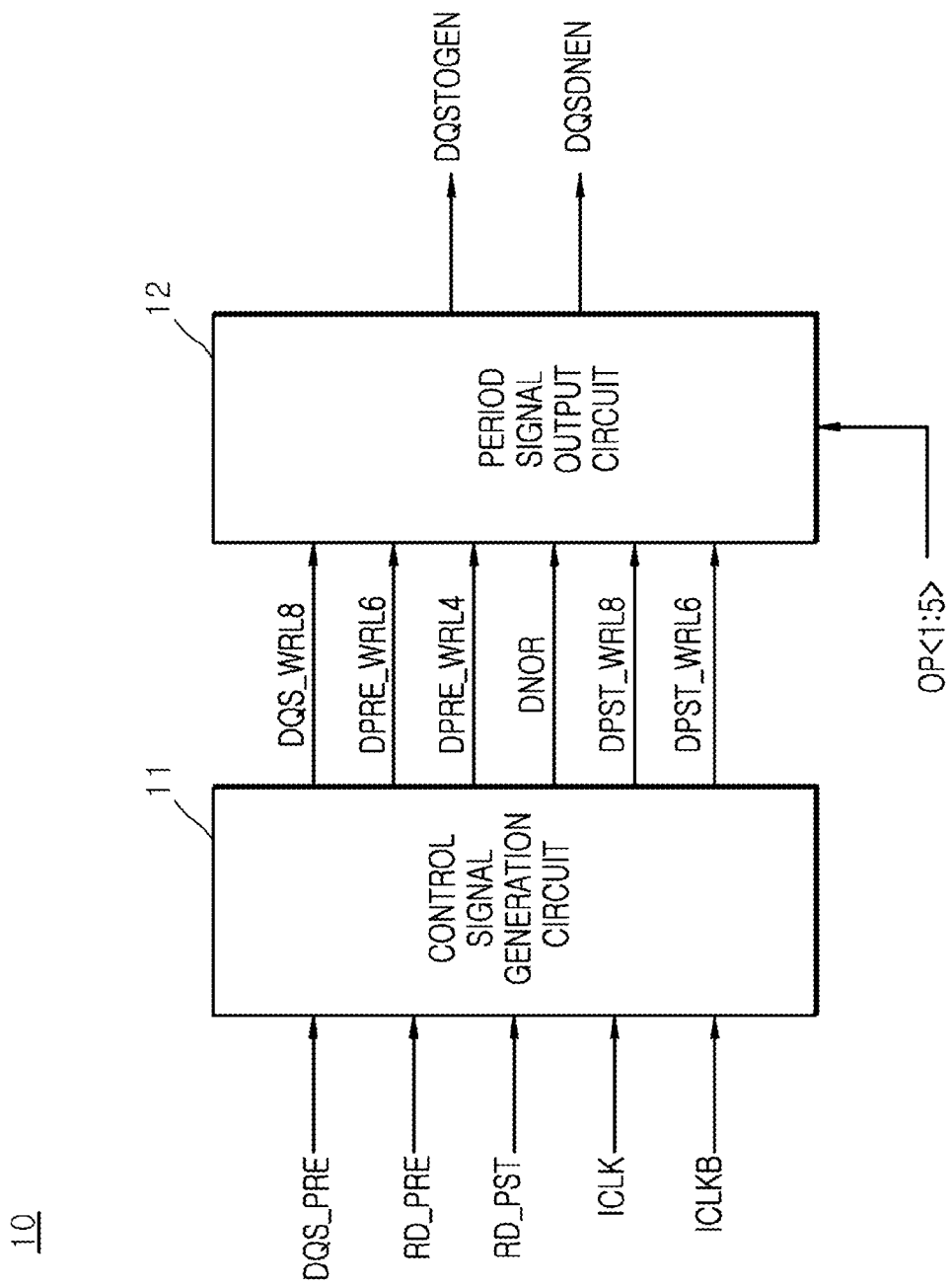
FIG. 2 is a block diagram illustrating a configuration of a period signal generation circuit included in the semiconductor device of FIG. 1.

Referring to FIG. 2, the period signal generation circuit 10 may include a control signal generation circuit 11 and a period signal output circuit 12.

The control signal generation circuit 11 may be synchronized with the first multiplication clock signal ICLK and the third multiplication clock signal ICLKB to generate a pre-period signal DQS_WRL8, a first preamble control signal DPRE_WRL6, a second preamble control signal DPRE_WRL4, a normal control signal DNOR, a first postamble control signal DPST_WRL8 and a second postamble control signal DPST_WRL6 in response to the pre-strobe signal DQS_PRE, the read pre-signal RD_PRE and the read post-signal RD_PST. The control signal generation circuit 11 may be synchronized with the first multiplication clock signal ICLK to generate the pre-period signal DQS_WRL8 from the pre-strobe signal DQS_PRE. The control signal generation circuit 11 may be synchronized with the first multiplication clock signal ICLK and the third multiplication clock signal ICLKB to generate the first preamble control signal DPRE_WRL6 and the second preamble control signal DPRE_WRL4 from the read pre-signal RD_PRE. The control signal generation circuit 11 may be synchronized with the first multiplication clock signal ICLK and the third multiplication clock signal ICLKB to generate the normal control signal DNOR from a third preamble control signal (DPRE_WRL2 of FIG. 3). The control signal generation circuit 11 may be synchronized with the first multiplication clock signal ICLK and the third multiplication clock signal ICLKB to generate the first postamble control signal DPST_WRL8 and the second postamble control signal DPST_WRL6 from the read post-signal RD_PST.

The period signal output circuit 12 may synthesize the pre-period signal DQS_WRL8, the first preamble control signal DPRE_WRL6, the second preamble control signal DPRE_WRL4, the first postamble control signal DPST_WRL8 and the second postamble control signal DPST_WRL6 to generate the toggling period signal DQSTOGEN and the down period signal DQSDNEN according to a logic level combination of the first to fifth operation codes OP<1:5>. Operations for generating the toggling period signal DQSTOGEN and the down period signal DQSDNEN whose enablement periods are controlled according to a logic level combination of the first to fifth operation codes OP<1:5> will be described later.

Figure 3:
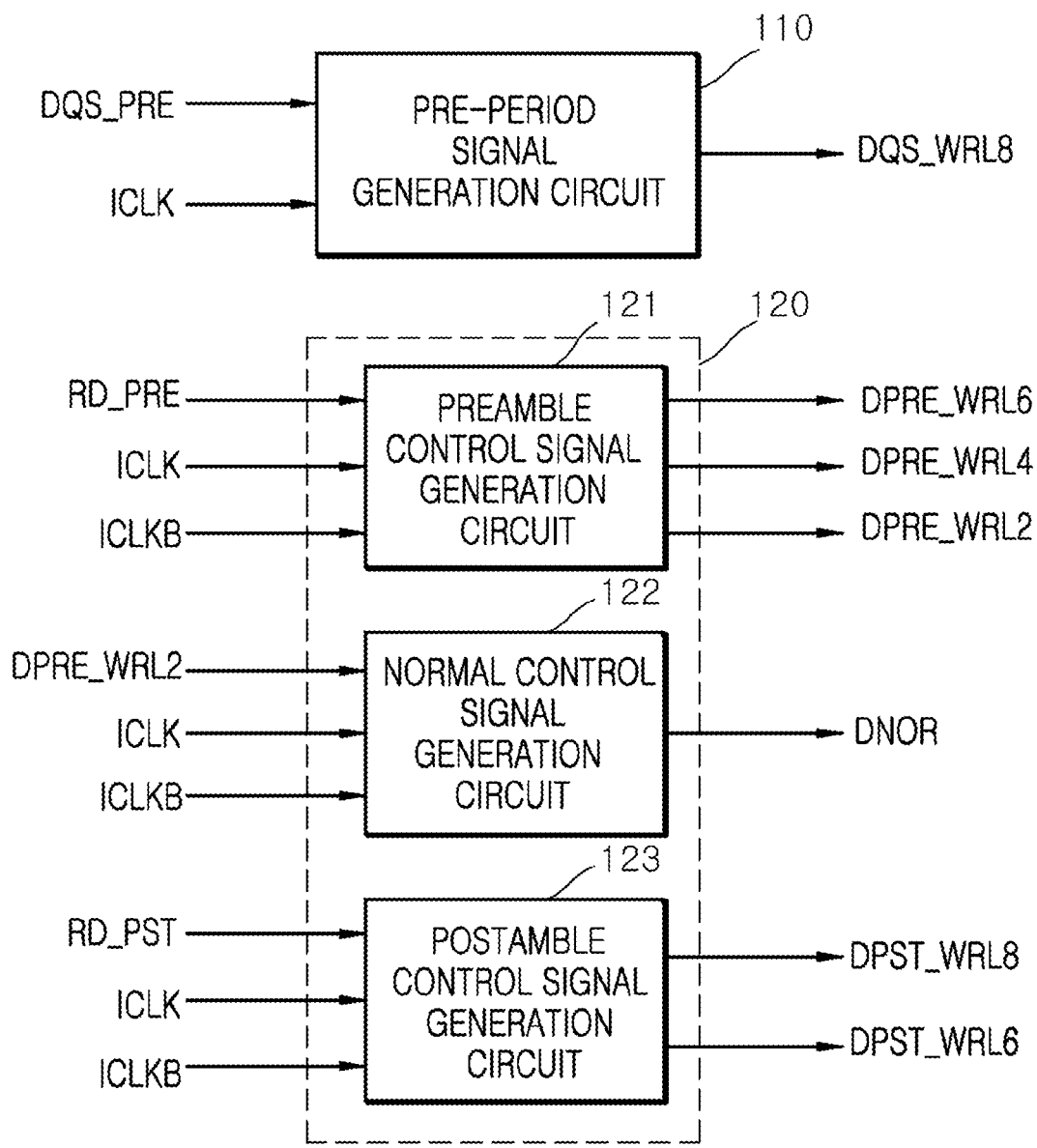
FIG. 3 is a block diagram illustrating a configuration of a control signal generation circuit included in the period signal generation circuit of FIG. 2.

Referring to FIG. 3, the control signal generation circuit 11 may include a pre-period signal generation circuit 110 and a toggling control signal generation circuit 120.

The pre-period signal generation circuit 110 may be synchronized with the first multiplication clock signal ICLK to generate the pre-period signal DQS_WRL8 which is enabled in response to the pre-strobe signal DQS_PRE. An operation for generating the pre-period signal DQS_WRL8 using the pre-period signal generation circuit 110 will be described with reference to FIG. 4 later.

The toggling control signal generation circuit 120 may include a preamble control signal generation circuit 121, a normal control signal generation circuit 122 and a postamble control signal generation circuit 123.

The preamble control signal generation circuit 121 may be synchronized with the first multiplication clock signal ICLK and the third multiplication clock signal ICLKB to generate the first preamble control signal DPRE_WRL6, the second preamble control signal DPRE_WRL4 and the third preamble control signal DPRE_WRL2 which are sequentially enabled in response to the read pre-signal RD_PRE.

The normal control signal generation circuit 122 may be synchronized with the first multiplication clock signal ICLK and the third multiplication clock signal ICLKB to generate the normal control signal DNOR which is enabled in response to the third preamble control signal DPRE_WRL2.

The postamble control signal generation circuit 123 may be synchronized with the first multiplication clock signal ICLK and the third multiplication clock signal ICLKB to generate the first postamble control signal DPST_WRL8 and the second postamble control signal DPST_WRL6 which are sequentially enabled in response to the read post-signal RD_PST.

As described above, the toggling control signal generation circuit 120 may be synchronized with the first multiplication clock signal ICLK and the third multiplication clock signal ICLKB to generate the first preamble control signal DPRE_WRL6, the second preamble control signal DPRE_WRL4 and the third preamble control signal DPRE_WRL2 which are sequentially enabled in response to the read pre-signal RD_PRE. In addition, the toggling control signal generation circuit 120 may be synchronized with the first multiplication clock signal ICLK and the third multiplication clock signal ICLKB to generate the normal control signal DNOR which is enabled in response to the third preamble control signal DPRE_WRL2. Moreover, the toggling control signal generation circuit 120 may be synchronized with the first multiplication clock signal ICLK and the third multiplication clock signal ICLKB to generate the first postamble control signal DPST_WRL8 and the second postamble control signal DPST_WRL6 which are sequentially enabled in response to the read post-signal RD_PST. Operations for generating the first preamble control signal DPRE_WRL6, the second preamble control signal DPRE_WRL4, the third preamble control signal DPRE_WRL2, the normal control signal DNOR, the first postamble control signal DPST_WRL8 and the second postamble control signal DPST_WRL6 using the toggling control signal generation circuit 120 will be described with reference to FIG. 5 later.

Figure 4:
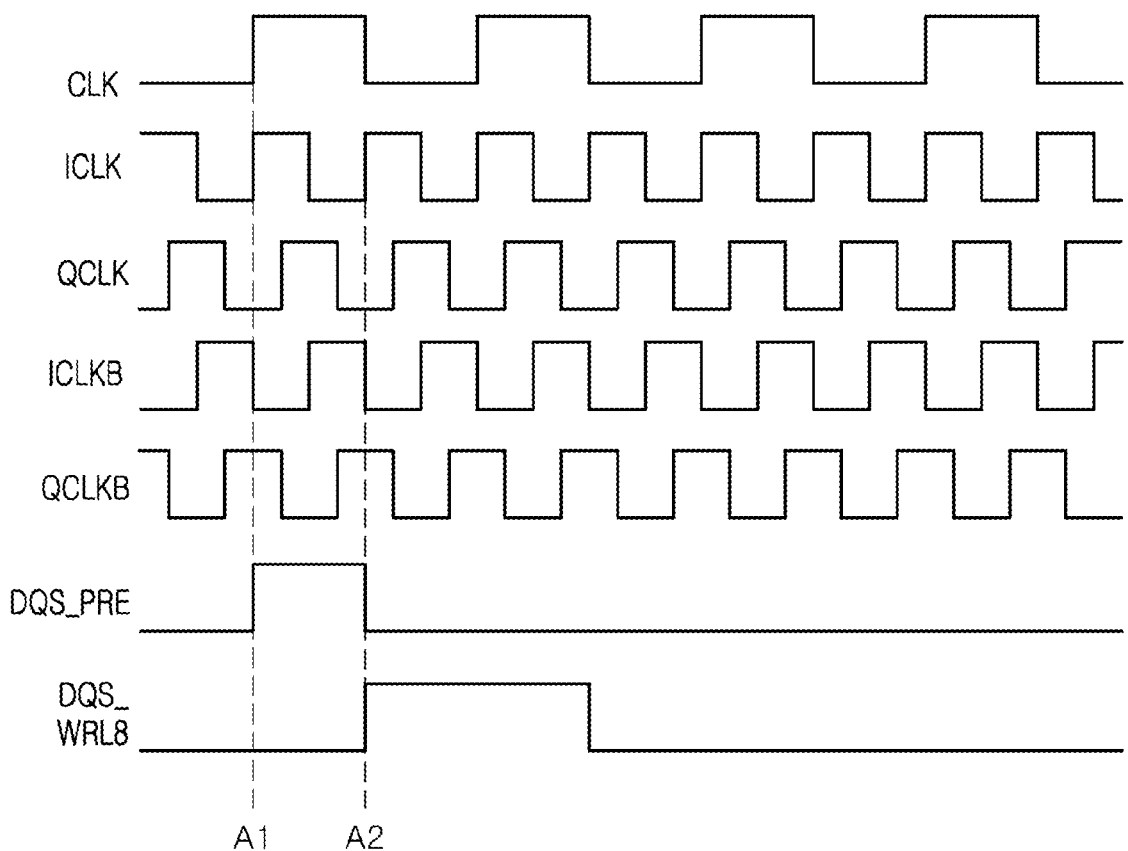
FIGS. 4 and 5 are timing diagrams illustrating operations of the control signal generation circuit shown in FIG. 3.

An operation for generating the pre-period signal DQS_WRL8 using the pre-period signal generation circuit 110 will be described hereinafter with reference to FIG. 4.

First, the frequency multiplication circuit 1 may increase a frequency of the external clock signal CLK to generate the first multiplication clock signal ICLK, the second multiplication clock signal QCLK, the third multiplication clock signal ICLKB and the fourth multiplication clock signal QCLKB in advance. The first multiplication clock signal ICLK, the second multiplication clock signal QCLK, the third multiplication clock signal ICLKB and the fourth multiplication clock signal QCLKB may be generated to have a frequency which is twice a frequency of the external clock signal CLK. The first multiplication clock signal ICLK may be generated to precede the second multiplication clock signal QCLK by a phase of 90 degrees. The second multiplication clock signal QCLK may be generated to precede the third multiplication clock signal ICLKB by a phase of 90 degrees. The third multiplication clock signal ICLKB may be generated to precede the fourth multiplication clock signal QCLKB by a phase of 90 degrees.

Next, an operation of the pre-period signal generation circuit 110 for generating the pre-period signal DQS_WRL8 in synchronization with the first multiplication clock signal ICLK will be described hereinafter.

At a point of time "A1", the semiconductor device may be synchronized with the external clock signal CLK to receive the pre-strobe signal DQS_PRE having a logic "high" level.

At a point of time "A2", the pre-period signal generation circuit 110 may be synchronized with the first multiplication clock signal ICLK to generate the pre-period signal DQS_WRL8 which is enabled to have a logic "high" level in response to the pre-strobe signal DQS_PRE that is inputted at the point of time "A1".

Figure 5:
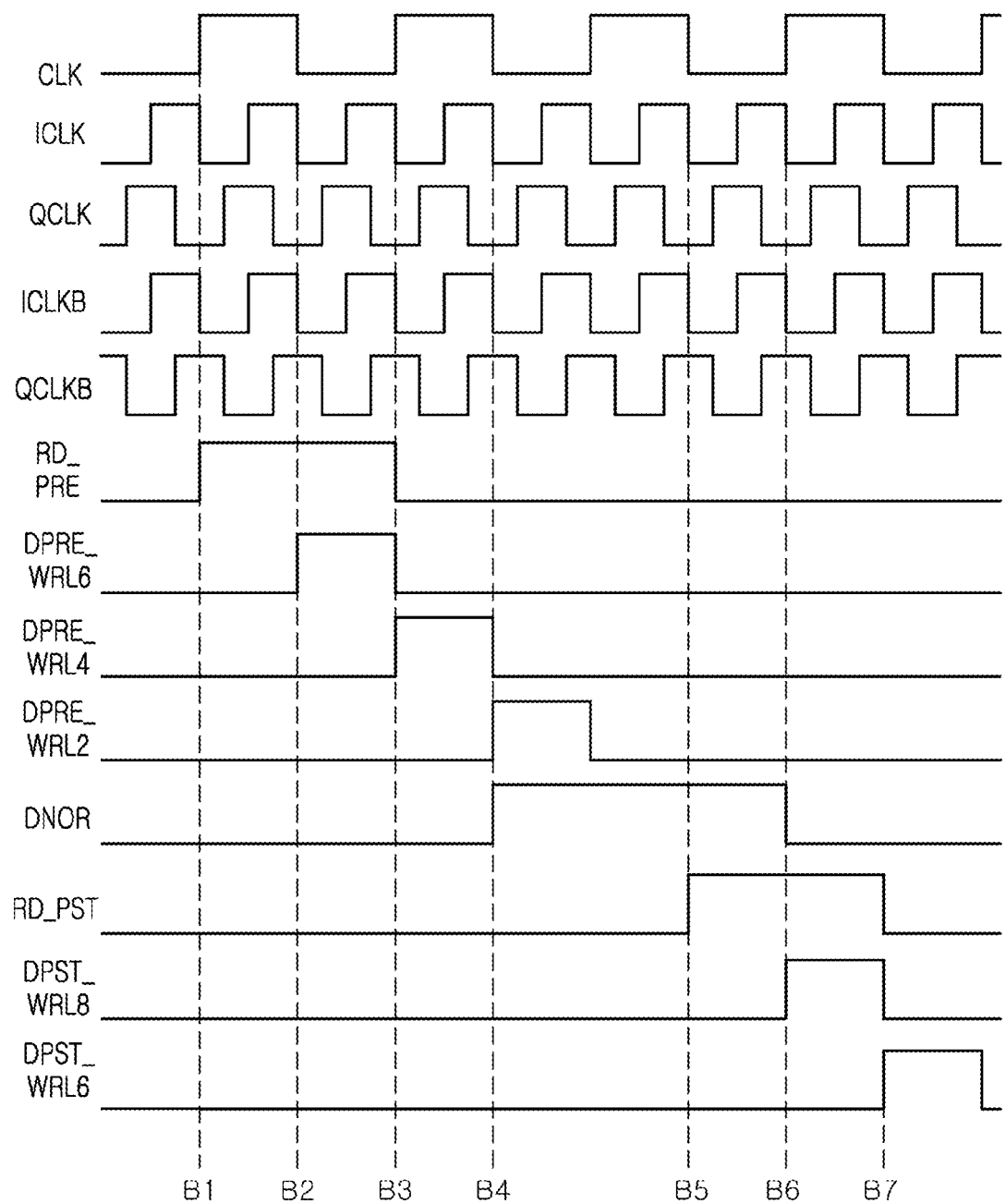

The operations of the toggling control signal generation circuit 120 for generating the first preamble control signal DPRE_WRL6, the second preamble control signal DPRE_WRL4, the third preamble control signal DPRE_WRL2, the normal control signal DNOR, the first postamble control signal DPST_WRL8 and the second postamble control signal DPST_WRL6 will be described hereinafter with reference to FIG. 5.

At a point of time "B1", the semiconductor device may be synchronized with the external clock signal CLK to receive the read pre-signal RD_PRE having a logic "high" level.

At a point of time "B2", the preamble control signal generation circuit 121 may be synchronized with the first multiplication clock signal ICLK and the third multiplication clock signal ICLKB to generate the first preamble control signal DPRE_WRL6 which is enabled to have a logic "high" level in response to the read pre-signal RD_PRE that is inputted at the point of time "B1".

At a point of time "B3", the preamble control signal generation circuit 121 may be synchronized with the first multiplication clock signal ICLK and the third multiplication clock signal ICLKB to generate the second preamble control signal DPRE_WRL4 which is enabled to have a logic "high" level in response to the first preamble control signal DPRE_WRL6 generated at the point of time "B2".

At a point of time "B4", the preamble control signal generation circuit 121 may be synchronized with the first multiplication clock signal ICLK and the third multiplication clock signal ICLKB to generate the third preamble control signal DPRE_WRL2 which is enabled to have a logic "high" level in response to the second preamble control signal DPRE_WRL4 generated at the point of time "B3".

The normal control signal generation circuit 122 may be synchronized with the first multiplication clock signal ICLK and the third multiplication clock signal ICLKB to generate the normal control signal DNOR which is enabled to have a logic "high" level in response to the third preamble control signal DPRE_WRL2.

At a point of time "B5", the semiconductor device may be synchronized with the external clock signal CLK to receive the read post-signal RD_PST having a logic "high" level.

At a point of time "B6", the postamble control signal generation circuit 123 may be synchronized with the first multiplication clock signal ICLK and the third multiplication clock signal ICLKB to generate the first postamble control signal DPST_WRL8 which is enabled to have a logic "high" level in response to the read post-signal RD_PST inputted at the point of time "B5".

At a point of time "B7", the postamble control signal generation circuit 123 may be synchronized with the first multiplication clock signal ICLK and the third multiplication clock signal ICLKB to generate the second postamble control signal DPST_WRL6 which is enabled to have a logic "high" level in response to the first postamble control signal DPST_WRL8 generated at the point of time "B6".

Figure 6:
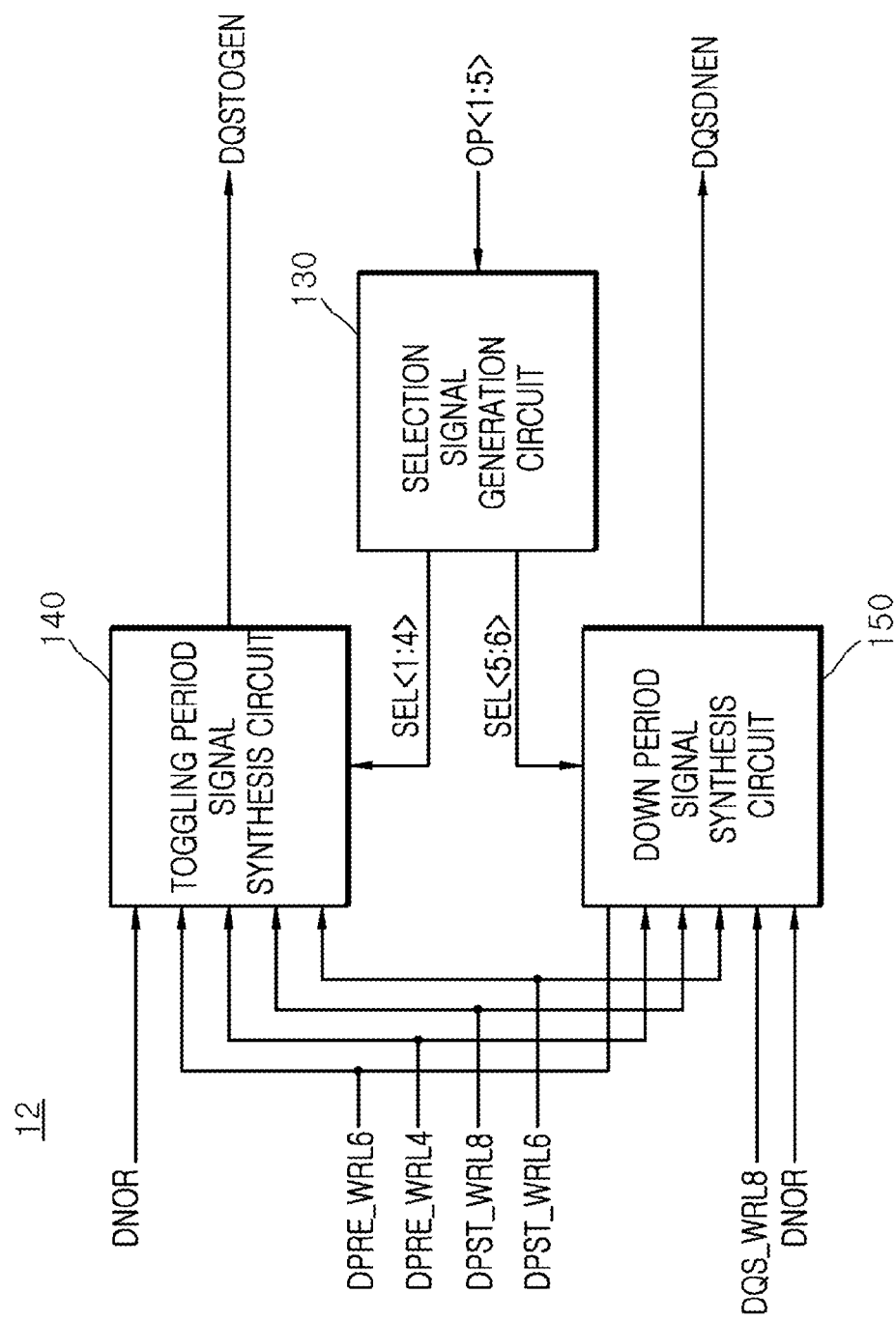
FIG. 6 is a block diagram illustrating a configuration of a period signal output circuit included in the period signal generation circuit of FIG. 2.

Referring to FIG. 6, the period signal output circuit 12 may include a selection signal generation circuit 130, a toggling period signal synthesis circuit 140 and a down period signal synthesis circuit 150.

The selection signal generation circuit 130 may generate first to sixth selection signals SEL<1:6> which are selectively enabled according to a logic level combination of the first to fifth operation codes OP<1:5>. The selection signal generation circuit 130 may decode the first to fifth operation codes OP<1:5> to generate the first to sixth selection signals SEL<1:6> which are selectively enabled. Logic levels of the first to sixth selection signals SEL<1:6> generated according to a logic level combination of the first to fifth operation codes OP<1:5> will be described with reference to FIGS. 7 and 8 later. In addition, various patterns of the strobe signal DQS according to logic level combinations of the first to fifth operation codes OP<1:5> during the preamble period and the postamble period will be described with reference to FIGS. 7 and 8 later.

The toggling period signal synthesis circuit 140 may synthesize the normal control signal DNOR, the first preamble control signal DPRE_WRL6, the second preamble control signal DPRE_WRL4, the first postamble control signal DPST_WRL8 and the second postamble control signal DPST_WRL6 to generate the toggling period signal DQSTOGEN in response to the first to fourth selection signals SEL<1:4>. The toggling period signal synthesis circuit 140 may synthesize the normal control signal DNOR, any one of the first and second preamble control signals DPRE_WRL6 and DPRE_WRL4, and any one of the first and second postamble control signals DPST_WRL8 and DPST_WRL6 according to the first to fourth selection signals SEL<1:4> to generate the toggling period signal DQSTOGEN.

The down period signal synthesis circuit 150 may synthesize the normal control signal DNOR, the pre-period signal DQS_WRL8, the first preamble control signal DPRE_WRL6, the second preamble control signal DPRE_WRL4, the first postamble control signal DPST_WRL8 and the second postamble control signal DPST_WRL6 to generate the down period signal DQSDNEN in response to the fifth and sixth selection signals SEL<5:6>. The down period signal synthesis circuit 150 may synthesize the normal control signal DNOR, the pre-period signal DQS_WRL8, any one of the first and second preamble control signals DPRE_WRL6 and DPRE_WRL4, and any one of the first and second postamble control signals DPST_WRL8 and DPST_WRL6 according to the fifth and sixth selection signals SEL<5:6> to generate the down period signal DQSDNEN.

Logic level combinations of the first and second operation codes OP<1:2> for setting patterns of the strobe signal DQS during the preamble period and logic levels of the first to fourth selection signals SEL<1:4> enabled according to the first and second operation codes OP<1:2> during the preamble period will be described hereinafter with reference to FIG. 7.

In the preamble period, the first operation code OP<1> may be set to have a logic "low (L)" level and the second operation code OP<2> may be set to have a logic "low (L)" level in order to set a first pattern of the strobe signal DQS. If the first operation code OP<1> has a logic "low (L)" level and the second operation code OP<2> has a logic "low (L)" level, the first, third and fourth selection signals SEL<1>, SEL<3> and SEL<4> may be disabled to have a logic "low (L)" level and the second selection signal SEL<2> may be enabled to have a logic "high (H)" level.

In the preamble period, the first operation code OP<1> may be set to have a logic "high (H)" level and the second operation code OP<2> may be set to have a logic "low (L)" level in order to set a second pattern of the strobe signal DQS. If the first operation code OP<1> has a logic "high (H)" level and the second operation code OP<2> has a logic "low (L)" level, all of the first, second, third and fourth selection signals SEL<1:4> may be disabled to have a logic "low (L)".

In the preamble period, the first operation code OP<1> may be set to have a logic "low (L)" level and the second operation code OP<2> may be set to have a logic "high (H)" level in order to set a third pattern of the strobe signal DQS. If the first operation code OP<1> has a logic "low (L)" level and the second operation code OP<2> has a logic "high (H)" level, the first selection signal SEL<1> may be enabled to have a logic "high (H)" level and all of the second to fourth selection signals SEL<2:4> may be disabled to have a logic "low (L)" level.

In the preamble period, the first operation code OP<1> may be set to have a logic "high (H)" level and the second operation code OP<2> may be set to have a logic "high (H)" level in order to set a fourth pattern of the strobe signal DQS. If the first operation code OP<1> has a logic "high (H)" level and the second operation code OP<2> has a logic "high (H)" level, the first selection signal SEL<1> may be enabled to have a logic "high (H)" level and all of the second to fourth selection signals SEL<2:4> may be disabled to have a logic "low (L)" level.

The first to fourth patterns of the strobe signal DQS set during the preamble period will be described with reference to FIG. 14 later.

Logic level combinations of the third to fifth operation codes OP<3:5> for setting patterns of the strobe signal DQS during the postamble period and logic levels of the fifth and sixth selection signals SEL<5:6> enabled according to the third to fifth operation codes OP<3:5> during the postamble period will be described hereinafter with reference to FIG. 8.

In the postamble period, all of the third to fifth operation codes OP<3:5> may be set to have a logic "low (L)" level in order to set a fifth pattern of the strobe signal DQS. If all of the third to fifth operation codes OP<3:5> have a logic "low (L)" level, the fifth selection signal SEL<5> may be disabled to have a logic "low (L)" level and the sixth selection signal SEL<6> may also be disabled to have a logic "low (L)" level.

In the postamble period, the third operation code OP<3> may be set to have a logic "high (H)" level and the fourth and fifth operation codes OP<4:5> may be set to have a logic "low (L)" level in order to set a sixth pattern of the strobe signal DQS. If the third operation code OP<3> has a logic "high (H)" level and the fourth and fifth operation codes OP<4:5> have a logic "low (L)" level, the fifth selection signal SEL<5> may be enabled to have a logic "high (H)" level and the sixth selection signal SEL<6> may be disabled to have a logic "low (L)" level.

In the postamble period, the fourth operation code OP<4> may be set to have a logic "high (H)" level and the third and fifth operation codes OP<3> and OP<5> may be set to have a logic "low (L)" level in order to set a seventh pattern of the strobe signal DQS. If the fourth operation code OP<4> has a logic "high (H)" level and the third and fifth operation codes OP<3> and OP<5> have a logic "low (L)" level, the fifth selection signal SEL<5> may be disabled to have a logic "low (L)" level and the sixth selection signal SEL<6> may be enabled to have a logic "high (H)" level.

In the postamble period, the third and fourth operation codes OP<3:4> may be set to have a logic "low (L)" level and the fifth operation code OP<5> may be set to have a logic "high (H)" level in order to set an eighth pattern of the strobe signal DQS. If the third and fourth operation codes OP<3:4> have a logic "low (L)" level and the fifth operation code OP<5> has a logic "high (H)" level, the fifth selection signal SEL<5> may be disabled to have a logic "low (L)" level and the sixth selection signal SEL<6> may also be disabled to have a logic "low (L)" level.

In the postamble period, the fourth operation code OP<4> may be set to have a logic "low (L)" level and the third and fifth operation codes OP<3> and OP<5> may be set to have a logic "high (H)" level in order to set a ninth pattern of the strobe signal DQS. If the fourth operation code OP<4> has a logic "low (L)" level and the third and fifth operation codes OP<3> and OP<5> have a logic "high (H)" level, the fifth selection signal SEL<5> may be disabled to have a logic "low (L)" level and the sixth selection signal SEL<6> may also be disabled to have a logic "low (L)" level.

In the postamble period, the third operation code OP<3> may be set to have a logic "low (L)" level and the fourth and fifth operation codes OP<4:5> may be set to have a logic "high (H)" level in order to set a tenth pattern of the strobe signal DQS. If the third operation code OP<3> has a logic "low (L)" level and the fourth and fifth operation codes OP<4:5> have a logic "high (H)" level, the fifth selection signal SEL<5> may be disabled to have a logic "low (L)"

level and the sixth selection signal SEL<6> may also be disabled to have a logic "low (L)" level.

The fifth to tenth patterns of the strobe signal DQS set during the postamble period will be described with reference to FIG. 15 later.

Figure 9:
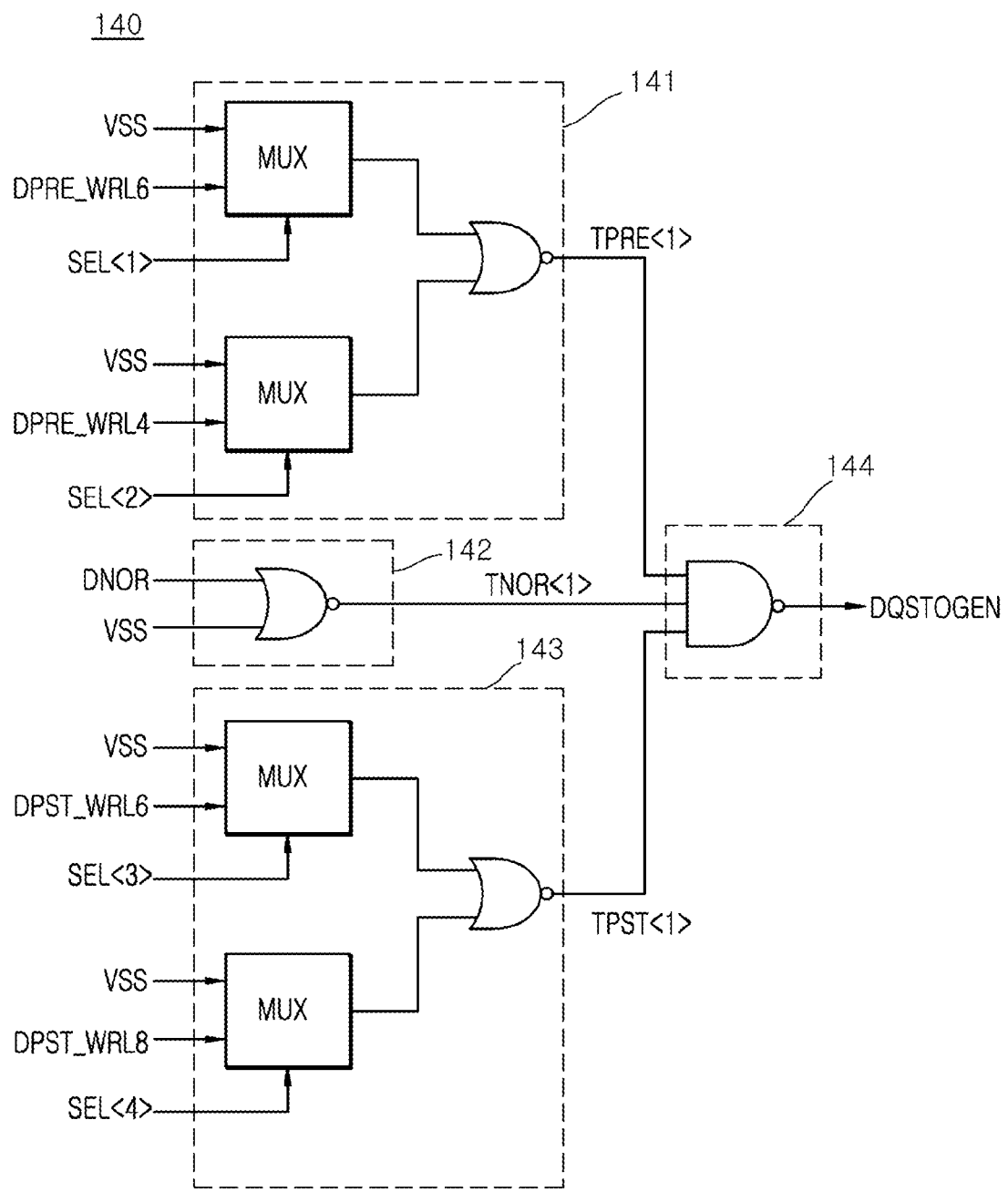
FIG. 9 is a circuit diagram illustrating a configuration of a toggling period signal synthesis circuit included in the period signal output circuit of FIG. 6.

Referring to FIG. 9, the toggling period signal synthesis circuit 140 may include a first selection/transmission circuit 141, a first logic circuit 142, a second selection/transmission circuit 143 and a second logic circuit 144.

The first selection/transmission circuit 141 may output a ground voltage VSS, the first preamble control signal DPRE_WRL6 or the second preamble control signal DPRE_WRL4 as a first pre-signal TPRE<1> in response to the first selection signal SEL<1> and the second selection signal SEL<2>. The first selection/transmission circuit 141 may inversely buffer the first preamble control signal DPRE_WRL6 to output the inversely buffered signal of the first preamble control signal DPRE_WRL6 as the first pre-signal TPRE<1> if the first selection signal SEL<1> is enabled and the second selection signal SEL<2> is disabled. The first selection/transmission circuit 141 may inversely buffer the second preamble control signal DPRE_WRL4 to output the inversely buffered signal of the second preamble control signal DPRE_WRL4 as the first pre-signal TPRE<1> if the first selection signal SEL<1> is disabled and the second selection signal SEL<2> is enabled. The first selection/transmission circuit 141 may inversely buffer the ground voltage VSS to output the inversely buffered signal of the ground voltage VSS as the first pre-signal TPRE<1> if the first selection signal SEL<1> is disabled and the second selection signal SEL<2> is disabled.

The first logic circuit 142 may inversely buffer the normal control signal DNOR in response to the ground voltage VSS to output the inversely buffered signal of the normal control signal DNOR as a first normal signal TNOR<1>. The first logic circuit 142 may perform a logical NOR operation of the ground voltage VSS and the normal control signal DNOR to generate the first normal signal TNOR<1>.

The second selection/transmission circuit 143 may output the ground voltage VSS, the first postamble control signal DPST_WRL8 or the second postamble control signal DPST_WRL6 as a first post-signal TPST<1> in response to the third selection signal SEL<3> and the fourth selection signal SEL<4>. The second selection/transmission circuit 143 may inversely buffer the second postamble control signal DPST_WRL6 to output the inversely buffered signal of the second postamble control signal DPST_WRL6 as the first post-signal TPST<1> if the third selection signal SEL<3> is enabled and the fourth selection signal SEL<4> is disabled. The second selection/transmission circuit 143 may inversely buffer the first postamble control signal DPST_WRL8 to output the inversely buffered signal of the first postamble control signal DPST_WRL8 as the first post-signal TPST<1> if the third selection signal SEL<3> is disabled and the fourth selection signal SEL<4> is enabled. The second selection/transmission circuit 143 may inversely buffer the ground voltage VSS to output the inversely buffered signal of the ground voltage VSS as the first post-signal TPST<1> if the third selection signal SEL<3> is disabled and the fourth selection signal SEL<4> is disabled.

The second logic circuit 144 may perform a logical NAND operation of the first pre-signal TPRE<1>, the first normal signal TNOR<1> and the first post-signal TPST<1> to generate the toggling period signal DQSTOGEN. The second logic circuit 144 may generate the toggling period signal DQSTOGEN which is enabled to have a logic "high" level if any one of the first pre-signal TPRE<1>, the first normal signal TNOR<1> and the first post-signal TPST<1> is generated to have a logic "low" level.

Figure 10:
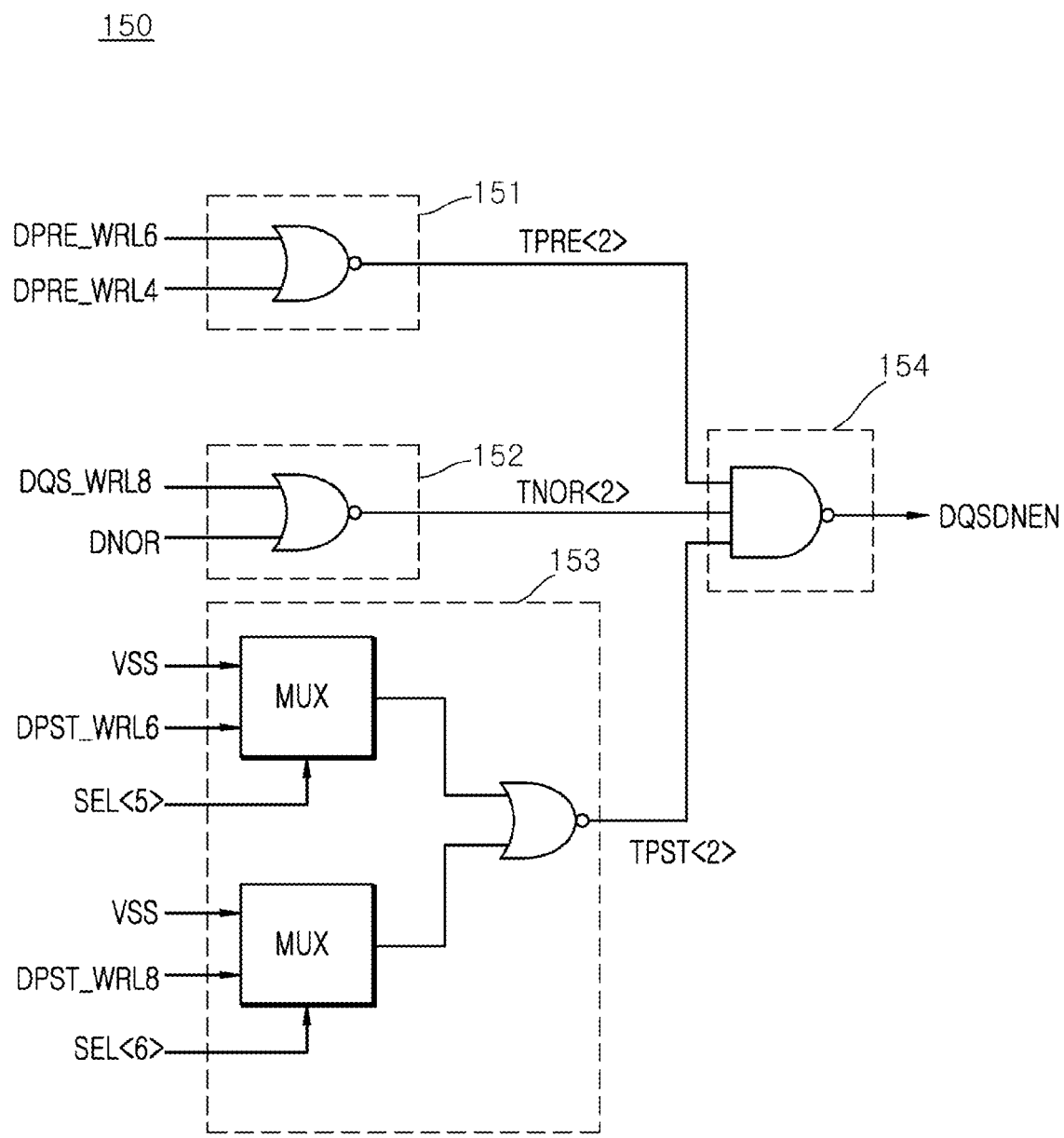
FIG. 10 is a circuit diagram illustrating a configuration of a down period signal synthesis circuit included in the period signal output circuit of FIG. 6.

Referring to FIG. 10, the down period signal synthesis circuit 150 may include a third logic circuit 151, a fourth logic circuit 152, a third selection/transmission circuit 153 and a fifth logic circuit 154.

The third logic circuit 151 may perform a logical NOR operation of the first preamble control signal DPRE_WRL6 and the second preamble control signal DPRE_WRL4 to generate a second pre-signal TPRE<2>. The third logic circuit 151 may generate the second pre-signal TPRE<2> which is enabled to have a logic "low" level if any one of the first preamble control signal DPRE_WRL6 and the second preamble control signal DPRE_WRL4 has a logic "high" level.

The fourth logic circuit 152 may perform a logical NOR operation of the pre-period signal DQS_WRL8 and the normal control signal DNOR to generate a second normal-signal TNOR<2>. The fourth logic circuit 152 may generate the second normal-signal TNOR<2> which is enabled to have a logic "low" level if any one of the pre-period signal DQS_WRL8 and the normal control signal DNOR has a logic "high" level.

The third selection/transmission circuit 153 may output the ground voltage VSS, the first postamble control signal DPST_WRL8 or the second postamble control signal DPST_WRL6 as a second post-signal TPST<2> in response to the fifth selection signal SEL<5> and the sixth selection signal SEL<6>. The third selection/transmission circuit 153 may inversely buffer the second postamble control signal DPST_WRL6 to output the inversely buffered signal of the second postamble control signal DPST_WRL6 as the second post-signal TPST<2> if the fifth selection signal SEL<5> is enabled and the sixth selection signal SEL<6> is disabled. The third selection/transmission circuit 153 may inversely buffer the first postamble control signal DPST_WRL8 to output the inversely buffered signal of the first postamble control signal DPST_WRL8 as the second post-signal TPST<2> if the fifth selection signal SEL<5> is disabled and the sixth selection signal SEL<6> is enabled. The third selection/transmission circuit 153 may inversely buffer the ground voltage VSS to output the inversely buffered signal of the ground voltage VSS as the second post-signal TPST<2> if the fifth selection signal SEL<5> is disabled and the sixth selection signal SEL<6> is disabled.

The fifth logic circuit 154 may perform a logical NAND operation of the second pre-signal TPRE<2>, the second normal signal TNOR<2> and the second post-signal TPST<2> to generate the down period signal DQSDNEN. The fifth logic circuit 154 may generate the down period signal DQSDNEN which is enabled to have a logic "high" level if any one of the second pre-signal TPRE<2>, the second normal signal TNOR<2> and the second post-signal TPST<2> is generated to have a logic "low" level.

Figure 11:
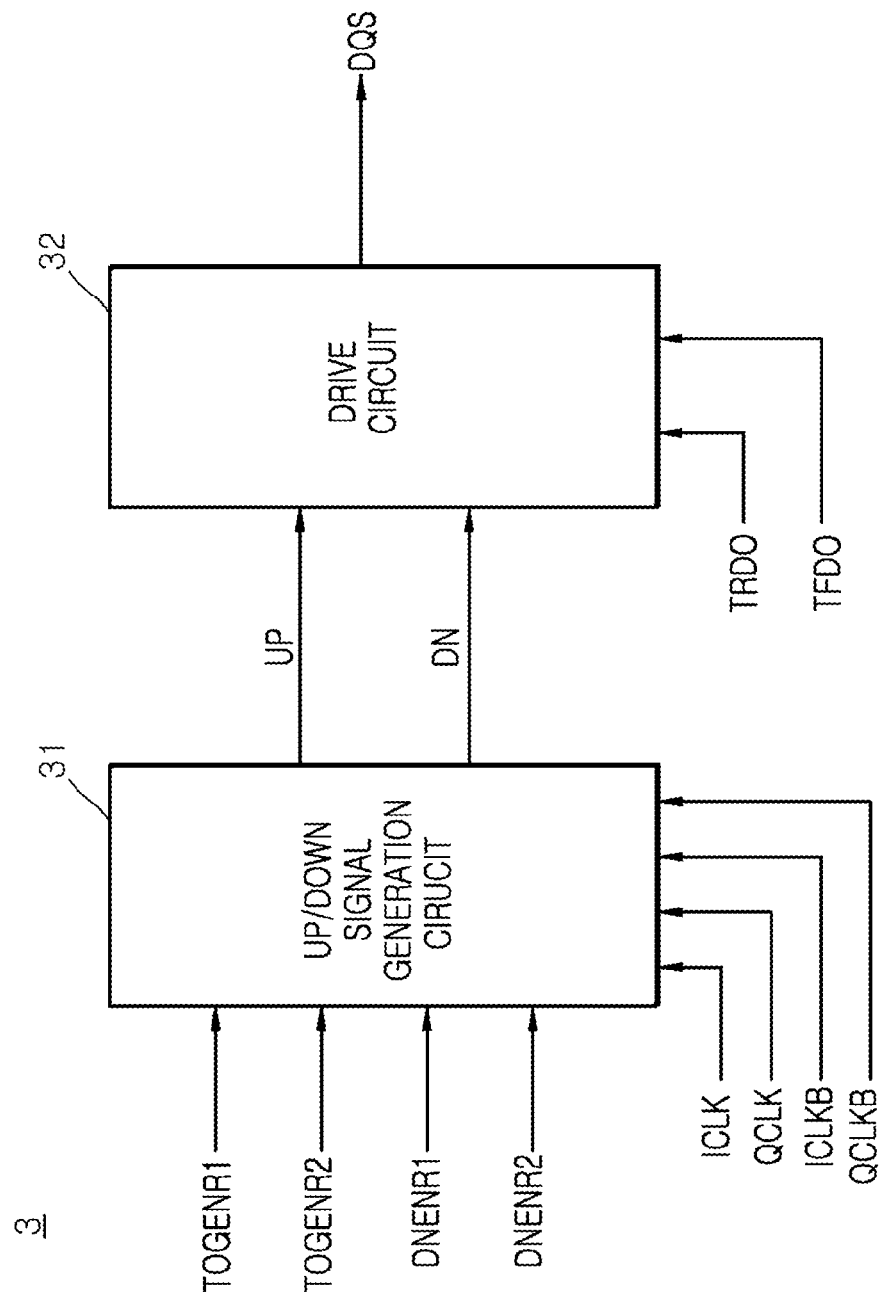
FIG. 11 is a block diagram illustrating a configuration of a strobe signal generation circuit included in the semiconductor device of FIG. 1.

Referring to FIG. 11, the strobe signal generation circuit 3 may include an up/down signal generation circuit 31 and a drive circuit 32.

The up/down signal generation circuit 31 may be synchronized with the first multiplication clock signal ICLK, the second multiplication clock signal QCLK, the third multiplication clock signal ICLKB and the fourth multiplication clock signal QCLKB to generate an up-signal UP in response to the first toggling drive signal TOGENR1, the second toggling drive signal TOGENR2, the first down drive signal DNENR1 and the second down drive signal DNENR2. The up/down signal generation circuit 31 may be synchronized with the first multiplication clock signal ICLK, the second multiplication clock signal QCLK, the third multiplication clock signal ICLKB and the fourth multiplication clock signal QCLKB to generate a down-signal DN in response to the first toggling drive signal TOGENR1, the second toggling drive signal TOGENR2, the first down drive signal DNENR1 and the second down drive signal DNENR2.

The drive circuit 32 may drive the strobe signal DQS according to logic levels of the up-signal UP and the down-signal DN in response to a rising output signal TRDO and a falling output signal TFDO. The drive circuit 32 may generate the strobe signal DQS having a logic "high" level if the up-signal UP has a logic "low" level in response to the rising output signal TRDO and the falling output signal TFDO. The drive circuit 32 may generate the strobe signal DQS having a logic "low" level if the down-signal DN has a logic "low" level in response to the rising output signal TRDO and the falling output signal TFDO. The rising output signal TRDO and the falling output signal TFDO may be set to be enabled during a predetermined operation such as a read operation for outputting the input data DIN as the output data DOUT.

Figure 12:
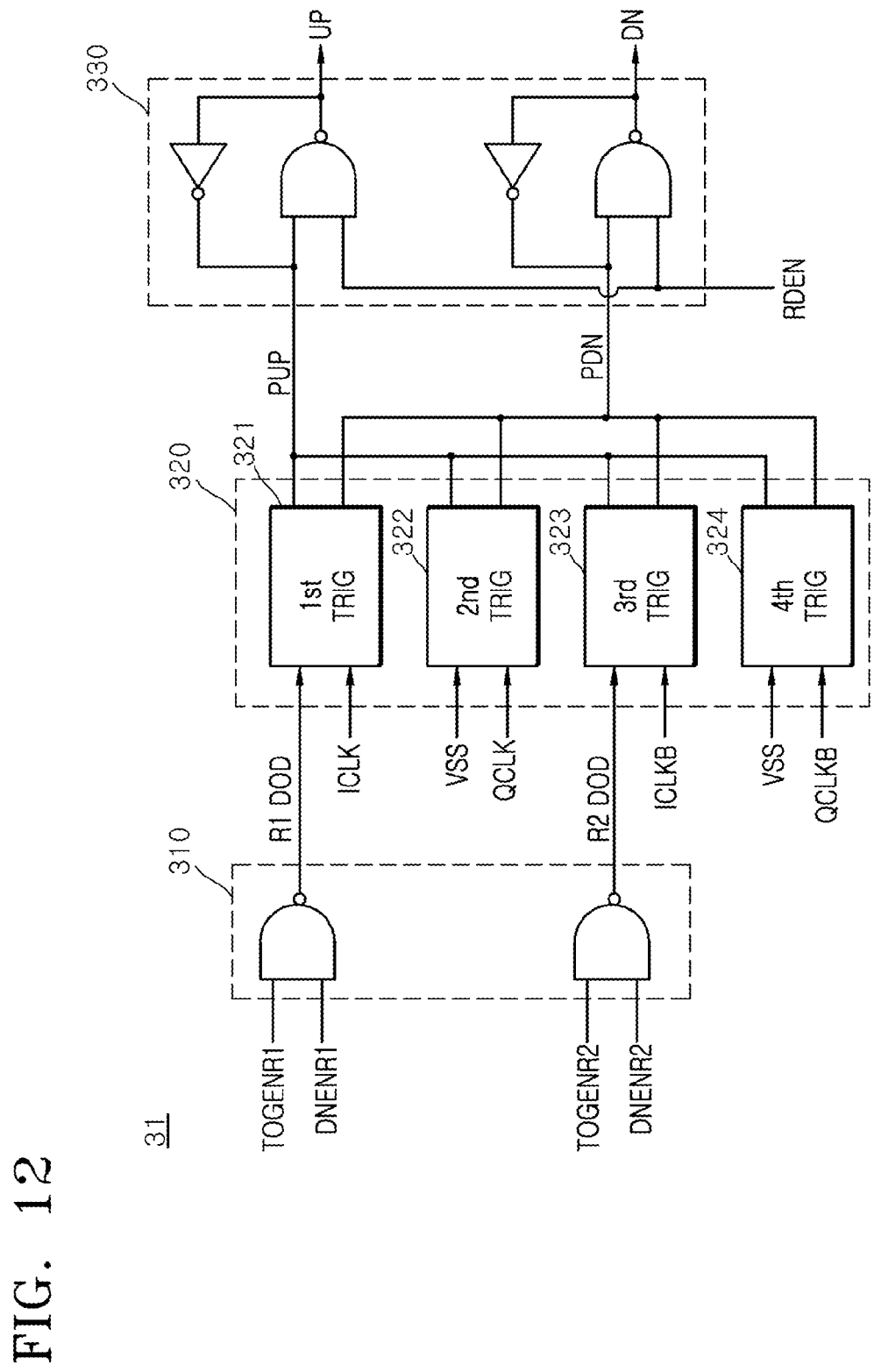
FIG. 12 is a circuit diagram illustrating a configuration of an up/down signal generation circuit included in the strobe signal generation circuit of FIG. 11.

Referring to FIG. 12, the up/down signal generation circuit 31 may include a trigger input signal generation circuit 310, a trigger circuit 320 and an up/down signal output circuit 330.

The trigger input signal generation circuit 310 may generate a first trigger input signal R1DOD in response to the first toggling drive signal TOGENR1 and the first down drive signal DNENR1. The trigger input signal generation circuit 310 may perform a logical NAND operation of the first toggling drive signal TOGENR1 and the first down drive signal DNENR1 to generate the first trigger input signal R1DOD. The trigger input signal generation circuit 310 may generate a second trigger input signal R2DOD in response to the second toggling drive signal TOGENR2 and the second down drive signal DNENR2. The trigger input signal generation circuit 310 may perform a logical NAND operation of the second toggling drive signal TOGENR2 and the second down drive signal DNENR2 to generate the second trigger input signal R2DOD.

The trigger circuit 320 may include a first trigger circuit 321, a second trigger circuit 322, a third trigger circuit 323, and a fourth trigger circuit 324.

The first trigger circuit 321 may output the first trigger input signal R1DOD as a pre-pull up signal PUP in response to the first multiplication clock signal ICLK. The first trigger circuit 321 may output the first trigger input signal R1DOD as the pre-pull up signal PUP while the first multiplication clock signal ICLK has a logic "high" level. The first trigger circuit 321 may invert the first trigger input signal R1DOD to output the inverted signal of the first trigger input signal R1DOD as a pre-pull down signal PDN in response to the first multiplication clock signal ICLK. The first trigger circuit 321 may invert the first trigger input signal R1DOD to output the inverted signal of the first trigger input signal R1DOD as the pre-pull down signal PDN while the first multiplication clock signal ICLK has a logic "high" level.

The second trigger circuit 322 may output the ground voltage VSS as the pre-pull up signal PUP in response to the second multiplication clock signal QCLK. The second trigger circuit 322 may output the ground voltage VSS as the pre-pull up signal PUP while the second multiplication clock signal QCLK has a logic "high" level. The second trigger circuit 322 may invert the ground voltage VSS to output the inverted signal of the ground voltage VSS as the pre-pull down signal PDN in response to the second multiplication clock signal QCLK. The second trigger circuit 322 may invert the ground voltage VSS to output the inverted signal of the ground voltage VSS as the pre-pull down signal PDN while the second multiplication clock signal QCLK has a logic "high" level.

The third trigger circuit 323 may output the second trigger input signal R2DOD as the pre-pull up signal PUP in response to the third multiplication clock signal ICLKB. The third trigger circuit 323 may output the second trigger input signal R2DOD as the pre-pull up signal PUP while the third multiplication clock signal ICLKB has a logic "high" level. The third trigger circuit 323 may invert the second trigger input signal R2DOD to output the inverted signal of the second trigger input signal R2DOD as the pre-pull down signal PDN in response to the third multiplication clock signal ICLKB. The third trigger circuit 323 may invert the second trigger input signal R2DOD to output the inverted signal of the second trigger input signal R2DOD as the pre-pull down signal PDN while the third multiplication clock signal ICLKB has a logic "high" level.

The fourth trigger circuit 324 may output the ground voltage VSS as the pre-pull up signal PUP in response to the fourth multiplication clock signal QCLKB. The fourth trigger circuit 324 may output the ground voltage VSS as the pre-pull up signal PUP while the fourth multiplication clock signal QCLKB has a logic "high" level. The fourth trigger circuit 324 may invert the ground voltage VSS to output the inverted signal of the ground voltage VSS as the pre-pull down signal PDN in response to the fourth multiplication clock signal QCLKB. The fourth trigger circuit 324 may invert the ground voltage VSS to output the inverted signal of the ground voltage VSS as the pre-pull down signal PDN while the fourth multiplication clock signal QCLKB has a logic "high" level.

As described above, the trigger circuit 320 may be synchronized with the first multiplication clock signal ICLK, the second multiplication clock signal QCLK, the third multiplication clock signal ICLKB or the fourth multiplication clock signal QCLKB to output the first trigger input signal R1DOD, the second trigger input signal R2DOD or the ground voltage VSS as the pre-pull up signal PUP. The trigger circuit 320 may be synchronized with the first multiplication clock signal ICLK, the second multiplication clock signal QCLK, the third multiplication clock signal ICLKB or the fourth multiplication clock signal QCLKB to output an inversely buffered signal of the first trigger input signal R1DOD, the second trigger input signal R2DOD or the ground voltage VSS as the pre-pull down signal PDN.

The up/down signal output circuit 330 may inversely buffer the pre-pull up signal PUP in response to a read enablement signal RDEN to output the inversely buffered signal of the pre-pull up signal PUP as the up-signal UP. The up/down signal output circuit 330 may inversely buffer the pre-pull up signal PUP to generate the up-signal UP if the read enablement signal RDEN is enabled to have a logic "high" level. The up/down signal output circuit 330 may inversely buffer the pre-pull down signal PDN in response to the read enablement signal RDEN to output the inversely buffered signal of the pre-pull down signal PDN as the down-signal DN. The up/down signal output circuit 330 may inversely buffer the pre-pull down signal PDN to generate the down-signal DN if the read enablement signal RDEN is enabled to have a logic "high" level. The read enablement signal RDEN may be set to be enabled during a predetermined operation such as the read operation for outputting the input data DIN as the output data DOUT.

Figure 13:
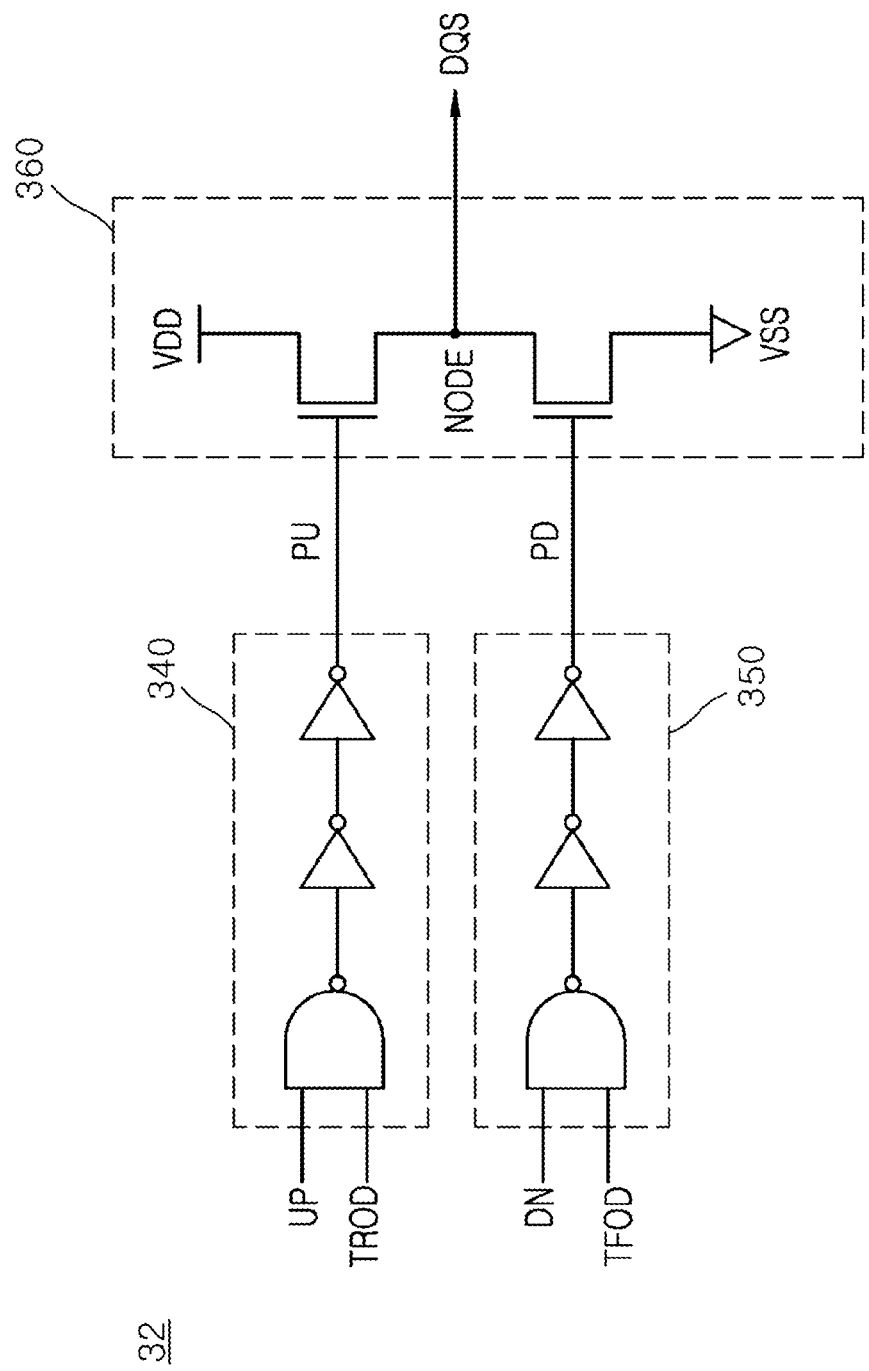
FIG. 13 is a circuit diagram illustrating a configuration of a drive circuit included in the strobe signal generation circuit of FIG. 11.

Referring to FIG. 13, the drive circuit 32 may include a pull-up signal generation circuit 340, a pull-down signal generation circuit 350 and an internal drive circuit 360.

The pull-up signal generation circuit 340 may inversely buffer the up-signal UP in response to the rising output signal TRDO to generate a pull-up signal PU. The pull-up signal generation circuit 340 may inversely buffer the up-signal UP to generate the pull-up signal PU if the rising output signal TRDO is enabled to have a logic "high" level.

The pull-down signal generation circuit 350 may inversely buffer the down-signal DN in response to the falling output signal TFDO to generate a pull-down signal PD. The pull-down signal generation circuit 350 may inversely buffer the down-signal DN to generate the pull-down signal PD if the falling output signal TFDO is enabled to have a logic "high" level.

The internal drive circuit 360 may pull up an output node NODE in response to the pull-up signal PU to output a signal of the pulled-up node as the strobe signal DQS or may pull down the output node NODE in response to the pull-down signal PD to output a signal of the pulled-down node as the strobe signal DQS. The internal drive circuit 360 may pull up the output node NODE to output the strobe signal DQS having a logic "high" level if the pull-up signal PU has a logic "high" level. The internal drive circuit 360 may pull down the output node NODE to output the strobe signal DQS having a logic "low" level if the pull-down signal PD has a logic "high" level. FIG. 13 also illustrates a voltage level VDD coupled to the node NODE.

Various patterns of the strobe signal DQS set during the preamble period will be described hereinafter with reference to FIG. 14.

In the following descriptions, a point of time "T3" may correspond to a starting point of time of the normal period that the input data DIN is outputted as the output data DOUT in synchronization with the strobe signal DQS. In addition, a first preamble period P1 may correspond to a period from a point of time "T1" till a point of time "T2", and a second preamble period P2 may correspond to a period from the point of time "T2" till a point of time "T3".

A first pattern of the strobe signal DQS may be the same as the first pattern illustrated in FIG. 7, and the first pattern may be set to have a fixed period that the strobe signal DQS maintains a logic "low (L)" level without any toggling during the second preamble period P2. That is, the first pattern may be set to have a fixed period that the strobe signal DQS maintains a logic "low (L)" level for four cycles of the internal clock signal WCLK.

A second pattern of the strobe signal DQS may be the same as the second pattern illustrated in FIG. 7, and the second pattern may be set to include a fixed period that the strobe signal DQS maintains a logic "low (L)" level in the second preamble period P2 and a toggling period that a level transition of the strobe signal DQS continuously occurs in the second preamble period P2. That is, the second pattern may be set to include a fixed period that the strobe signal DQS maintains a logic "low (L)" level for two cycles of the internal clock signal WCLK in the second preamble period P2 and a toggling period that a level transition of the strobe signal DQS continuously occurs for two cycles of the internal clock signal WCLK in the second preamble period P2.

A third pattern of the strobe signal DQS may be the same as the third pattern illustrated in FIG. 7, and the third pattern may be set to have a toggling period that a level transition of the strobe signal DQS continuously occurs during the second preamble period P2. That is, the third pattern may be set to have a toggling period that a level transition of the strobe signal DQS continuously occurs for four cycles of the internal clock signal WCLK in the second preamble period P2.

A fourth pattern of the strobe signal DQS may be the same as the fourth pattern illustrated in FIG. 7, and the fourth pattern may be set to include a fixed period that the strobe signal DQS maintains a logic "low (L)" level during the first preamble period P1 and a toggling period that a level transition of the strobe signal DQS continuously occurs during the second preamble period P2. That is, the fourth pattern may be set to include a fixed period that the strobe signal DQS maintains a logic "low (L)" level for two cycles of the internal clock signal WCLK in the first preamble period P1 and a toggling period that a level transition of the strobe signal DQS continuously occurs for four cycles of the internal clock signal WCLK in the second preamble period P2.

Various patterns of the strobe signal DQS set during the postamble period will be described hereinafter with reference to FIG. 15.

In the following descriptions, a point of time "T4" may correspond to an ending point of time of the normal period that the input data DIN is outputted as the output data DOUT in synchronization with the strobe signal DQS. In addition, a postamble period P3 may correspond to a period from a point of time "T4" till a point of time "T5".

A fifth pattern of the strobe signal DQS may be the same as the fifth pattern illustrated in FIG. 8, and the fifth pattern may be set to have a fixed period that the strobe signal DQS maintains a logic "low (L)" level prior to the postamble period P3. That is, the fifth pattern may be set to have a fixed period that the strobe signal DQS maintains a logic "low (L)" level for half a cycle of the internal clock signal WCLK prior to the postamble period P3.

A sixth pattern of the strobe signal DQS may be the same as the sixth pattern illustrated in FIG. 8, and the sixth pattern may be set to include a fixed period that the strobe signal DQS maintains a logic "low (L)" level prior to the postamble period P3 and a toggling period that a level transition of the strobe signal DQS continuously occurs in the postamble period P3. That is, the sixth pattern may be set to include a fixed period that the strobe signal DQS maintains a logic "low (L)" level for half a cycle of the internal clock signal WCLK prior to the postamble period P3 and a toggling period that a level transition of the strobe signal DQS continuously occurs for two cycles of the internal clock signal WCLK in the postamble period P3.

A seventh pattern of the strobe signal DQS may be the same as the seventh pattern illustrated in FIG. 8, and the seventh pattern may be set to include a fixed period that the strobe signal DQS maintains a logic "low (L)" level prior to the postamble period P3 and a toggling period that a level transition of the strobe signal DQS continuously occurs during the postamble period P3. That is, the seventh pattern may be set to include a fixed period that the strobe signal DQS maintains a logic "low (L)" level for half a cycle of the internal clock signal WCLK prior to the postamble period P3 and a toggling period that a level transition of the strobe signal DQS continuously occurs for four cycles of the internal clock signal WCLK in the postamble period P3.

An eighth pattern of the strobe signal DQS may be the same as the eighth pattern illustrated in FIG. 8, and the eighth pattern may be set to have a fixed period that the strobe signal DQS maintains a logic "low (L)" level prior to the postamble period P3. That is, the eighth pattern may be set to have a fixed period that the strobe signal DQS maintains a logic "low (L)" level for half a cycle of the internal clock signal WCLK prior to the postamble period P3. The eighth pattern may be set to be the same pattern as the fifth pattern.

A ninth pattern of the strobe signal DQS may be the same as the ninth pattern illustrated in FIG. 8, and the ninth pattern may be set to include a fixed period that the strobe signal DQS maintains a logic "low (L)" level prior to the postamble period P3 and another fixed period that the strobe signal DQS maintains a logic "low (L)" level in the postamble period P3. That is, the ninth pattern may be set to include a fixed period that the strobe signal DQS maintains a logic "low (L)" level for half a cycle of the internal clock signal WCLK prior to the postamble period P3 and another fixed period that the strobe signal DQS maintains a logic "low (L)" level for two cycles of the internal clock signal WCLK in the postamble period P3.

A tenth pattern of the strobe signal DQS may be the same as the tenth pattern illustrated in FIG. 8, and the tenth pattern may be set to include a fixed period that the strobe signal DQS maintains a logic "low (L)" level prior to the postamble period P3 and another fixed period that the strobe signal DQS maintains a logic "low (L)" level during the postamble period P3. That is, the tenth pattern may be set to include a fixed period that the strobe signal DQS maintains a logic "low (L)" level for half a cycle of the internal clock signal WCLK prior to the postamble period P3 and another fixed period that the strobe signal DQS maintains a logic "low (L)" level for four cycles of the internal clock signal WCLK in the postamble period P3.

Figure 14:
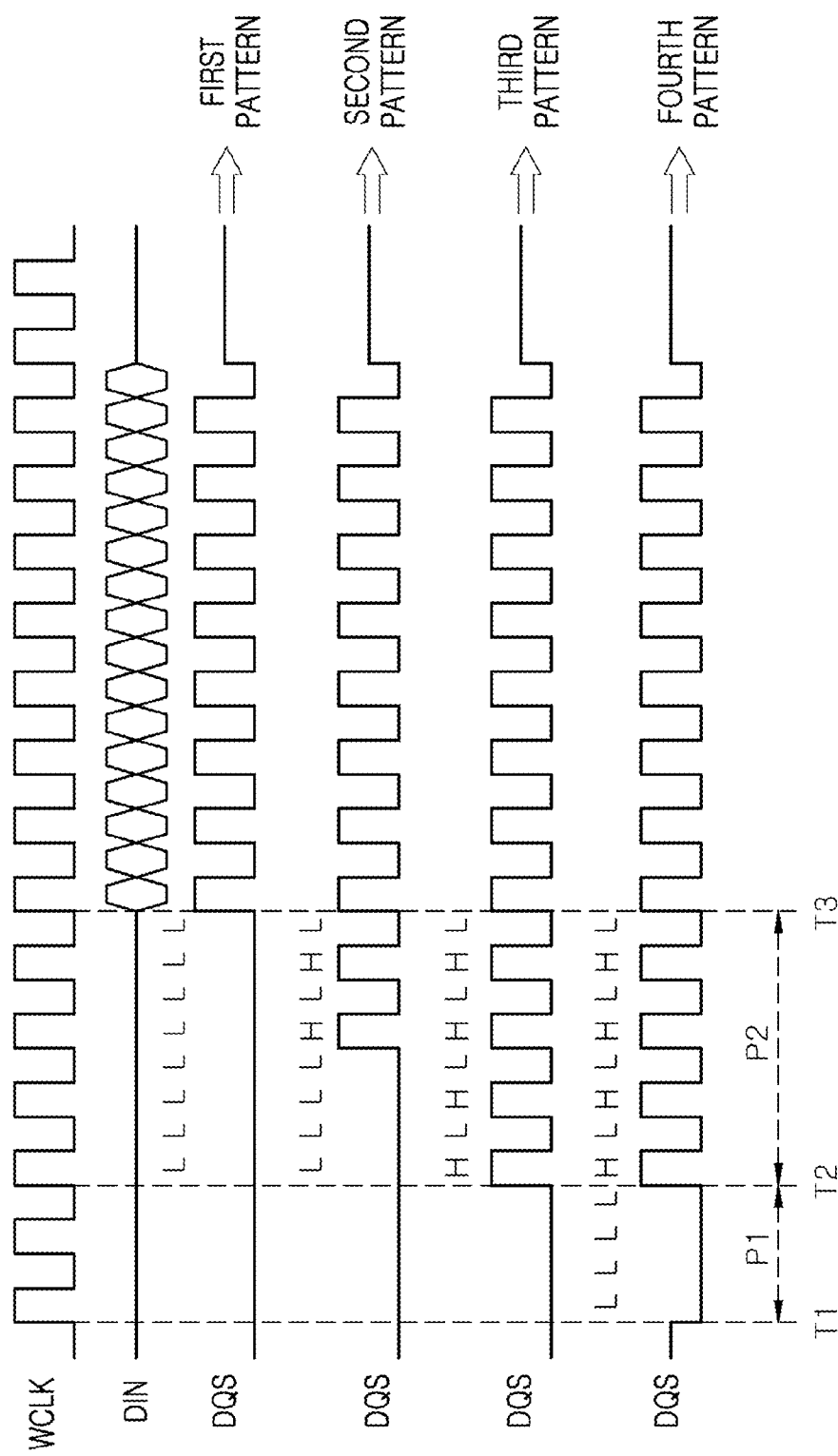
FIGS. 14 and 15 are timing diagrams illustrating operations of a semiconductor device according to an embodiment of the present disclosure.
Figure 15:
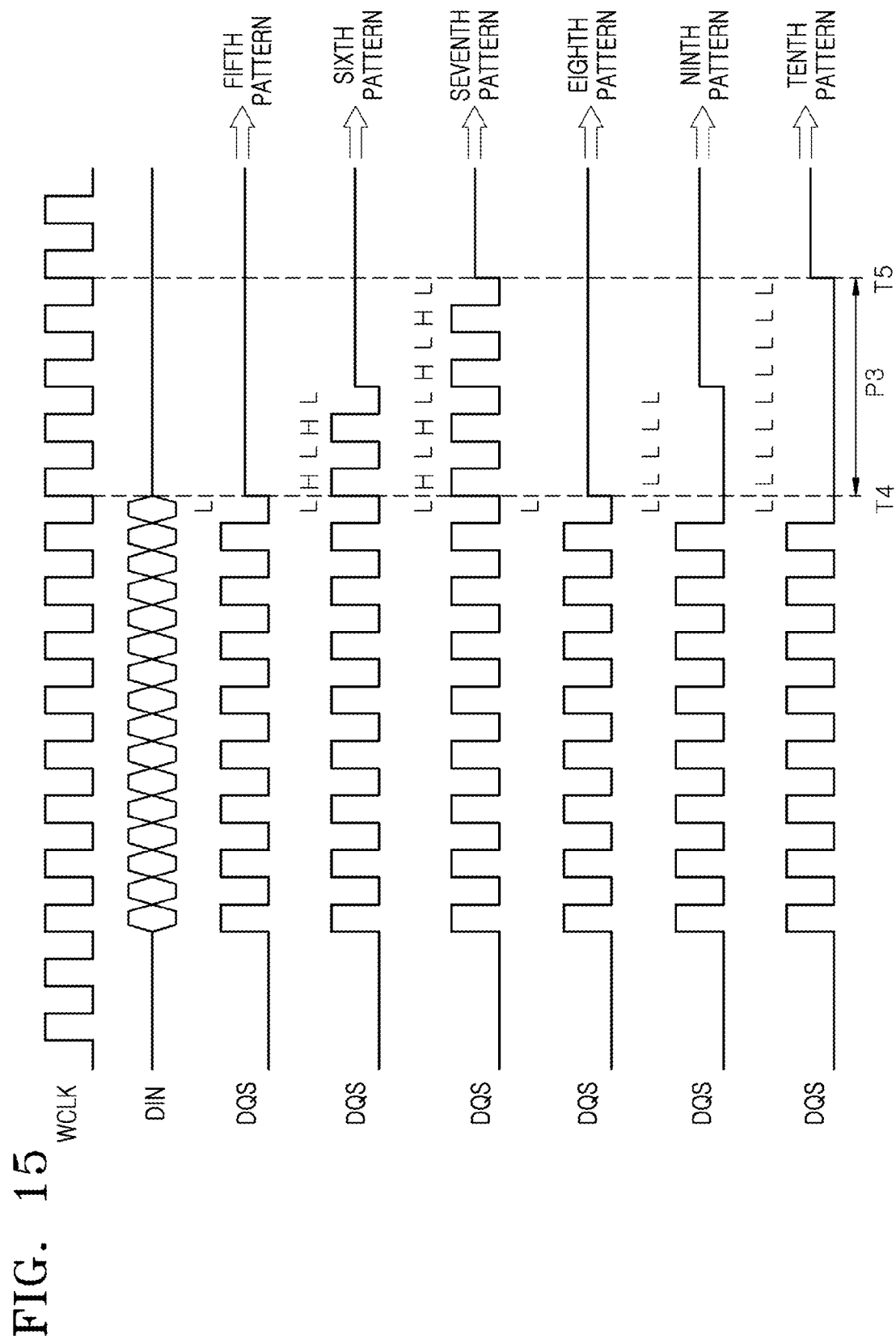

As illustrated in FIGS. 14 and 15, the patterns of the strobe signal DQS generated by the semiconductor device according an embodiment may be set to include twenty-four patterns since the strobe signal DQS is generated to have four patterns in the preamble period and six patterns in the postamble period. The number of the patterns of the strobe signal DQS may also be set to be less or greater than twenty-four according to the embodiments.

As described above, a semiconductor device according to an embodiment may generate various patterns of a strobe signal in a preamble period and in a postamble period. In addition, the semiconductor device may be designed to set a period for toggling the strobe signal even without a circuit for controlling generation periods of multiplication clock signals. Thus, it may be possible to reduce a layout area of the semiconductor device and the power consumption of the semiconductor device. Moreover, the semiconductor device may generate the strobe signal using signals generated according to a level combination of operation codes even without using a circuit for controlling generation periods of multiplication clock signals. Accordingly, it may be possible to improve an operation speed of the semiconductor device.

Furthermore, according to an embodiment of the present disclosure, a circuit for generating the strobe signal may be simplified without using a circuit for controlling generation periods of multiplication clock signals. Therefore, it may be possible to improve a skew of input data and the strobe signal in the semiconductor device.

Figure 16:
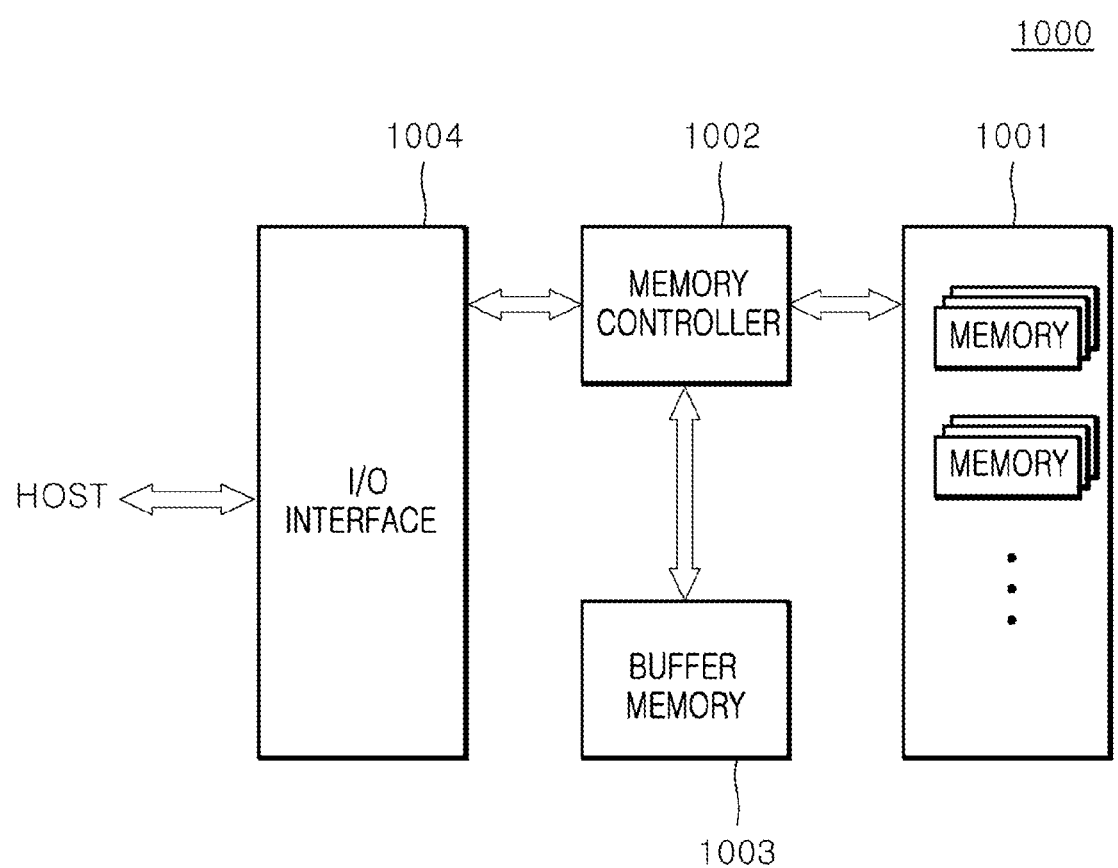
FIG. 16 is a block diagram illustrating a configuration of an electronic system employing the semiconductor device shown in FIGS. 1 to 15.

The semiconductor devices described with reference to FIGS. 1 to 15 may be applied to an electronic system that includes a memory system, a graphic system, a computing system, a mobile system, or the like. For example, as illustrated in FIG. 16, an electronic system 1000 according to an embodiment may include a data storage circuit 1001, a memory controller 1002, a buffer memory 1003, and an input/output (I/O) interface 1004.

The data storage circuit 1001 may store data which are outputted from the memory controller 1002 or may read and output the stored data to the memory controller 1002, according to a control signal generated by the memory controller 1002. The data storage circuit 1001 may include the semiconductor devices illustrated in FIG. 1. Meanwhile, the data storage circuit 1001 may include a nonvolatile memory that can retain their stored data even when its power supply is interrupted. The nonvolatile memory may be a flash memory such as a NOR-type flash memory or a NAND-type flash memory, a phase change random access memory (PRAM), a resistive random access memory (RRAM), a spin transfer torque random access memory (STTRAM), a magnetic random access memory (MRAM), or the like.

The memory controller 1002 may receive a command outputted from an external device (e.g., a host device) through the I/O interface 1004 and may decode the command outputted from the host device to control an operation for inputting data into the data storage circuit 1001 or the buffer memory 1003 or for outputting the data stored in the data storage circuit 1001 or the buffer memory 1003. Although FIG. 16 illustrates the memory controller 1002 with a single block, the memory controller 1002 may include one controller for controlling the data storage circuit 1001 comprised of a nonvolatile memory and another controller for controlling the buffer memory 1003 comprised of a volatile memory.

The buffer memory 1003 may temporarily store the data to be processed by the memory controller 1002. That is, the buffer memory 1003 may temporarily store the data which are outputted from or to be inputted to the data storage circuit 1001. The buffer memory 1003 may store the data, which are outputted from the memory controller 1002, according to a control signal. The buffer memory 1003 may read and output the stored data to the memory controller 1002. The buffer memory 1003 may include a volatile memory such as a dynamic random access memory (DRAM), a mobile DRAM, or a static random access memory (SRAM).

The I/O interface 1004 may physically and electrically connect the memory controller 1002 to the external device (i.e., the host). Thus, the memory controller 1002 may receive control signals and data supplied from the external device (i.e., the host) through the I/O interface 1004 and may output the data generated from the memory controller 1002 to the external device (i.e., the host) through the I/O interface 1004. That is, the electronic system 1000 may communicate with the host through the I/O interface 1004. The I/O interface 1004 may include any one of various interface protocols such as a universal serial bus (USB), a multi-media card (MMC), a peripheral component interconnect-express (PCI-E), a serial attached SCSI (SAS), a serial AT attachment (SATA), a parallel AT attachment (PATA), a small computer system interface (SCSI), an enhanced small device interface (ESDI) and an integrated drive electronics (IDE).

The electronic system 1000 may be used as an auxiliary storage device of the host or an external storage device. The electronic system 1000 may include a solid state disk (SSD), a USB memory, a secure digital (SD) card, a mini secure digital (mSD) card, a micro secure digital (micro SD) card, a secure digital high capacity (SDHC) card, a memory stick card, a smart media (SM) card, a multi-media card (MMC), an embedded multi-media card (eMMC), a compact flash (CF) card, or the like.

What is claimed is:

1. A semiconductor device comprising:
a period signal generation circuit configured to generate a toggling period signal and a down period signal whose enablement periods are controlled according to operation codes in response to a read post signal;
a synchronization circuit configured to be synchronized with a first multiplication clock signal and a second multiplication clock signal to generate a first toggling drive signal and a second toggling drive signal from the toggling period signal and configured to be synchronized with the first and second multiplication clock signals to generate a first down drive signal and a second down drive signal from the down period signal; and
a strobe signal generation circuit configured to set a postamble period and a normal period in response to the first and second toggling drive signals and the first and second down drive signals and configured to generate a strobe signal which is toggled during the normal period.

2. The semiconductor device of claim 1,
wherein the period signal generation circuit is configured to generate the toggling period signal and the down period signal whose enablement periods are controlled according to the operation codes in response to the pre-strobe signal, the read pre-signal and the read post signal, and
wherein the strobe signal generation circuit is configured to set a preamble period, the postamble period and the normal period in response to the first and second toggling drive signals and the first and second down drive signals.

3. The semiconductor device of claim 2,
wherein the number "2M" of patterns of the strobe signal is set according to the operation codes during the preamble period (where, "M" denotes a natural number); and
wherein the number "2N" of patterns of the strobe signal is set according to the operation codes during the postamble period (where, "N" denotes a natural number).

4. The semiconductor device of claim 2, wherein each of the preamble period and the postamble period is set to include at least one of a toggling period and a fixed period of the strobe signal.

5. The semiconductor device of claim 2, wherein the period signal generation circuit includes:
a control signal generation circuit configured to be synchronized with the first and second multiplication clock signals to generate a pre-period signal, a first preamble control signal, a second preamble control signal, a normal control signal, a first postamble control signal and a second postamble control signal in response to the pre-strobe signal, the read pre-signal and the read post-signal; and
a period signal output circuit configured to synthesize the pre-period signal, the first and second preamble control signals, and the first and second postamble control signals to generate the toggling period signal and the down period signal according to a logic level combination of the operation codes.

6. The semiconductor device of claim 5, wherein the control signal generation circuit includes:
a pre-period signal generation circuit configured to be synchronized with the first multiplication clock signal to generate the pre-period signal which is enabled in response to the pre-strobe signal; and
a toggling control signal generation circuit configured to be synchronized with the first and second multiplication clock signals to generate the first and second preamble control signals, a third preamble control signal, the normal control signal, and the first and second postamble control signals in response to the read pre-signal and the read post-signal.

7. The semiconductor device of claim 6, wherein the toggling control signal generation circuit includes:
a preamble control signal generation circuit configured to be synchronized with the first and second multiplication clock signals to generate the first to third preamble control signals which are sequentially enabled in response to the read pre-signal;
a normal control signal generation circuit configured to be synchronized with the first and second multiplication clock signals to generate the normal control signal which is enabled if the third preamble control signal is enabled; and
a postamble control signal generation circuit configured to be synchronized with the first and second multiplication clock signals to generate the first and second postamble control signals which are sequentially enabled in response to the read post-signal.

8. The semiconductor device of claim 5, wherein the period signal output circuit includes:
a selection signal generation circuit configured to generate first to sixth selection signals which are selectively enabled according to a logic level combination of the operation codes;
a toggling period signal synthesis circuit configured to synthesize the normal control signal, the first and second preamble control signals, and the first and second postamble control signals to output the synthesized signal as the toggling period signal in response to the first to fourth selection signals; and
a down period signal synthesis circuit configured to synthesize the normal control signal, the pre-period signal, the first and second preamble control signals, and the first and second postamble control signals to generate the down period signal in response to the fifth and sixth selection signals.

9. The semiconductor device of claim 8, wherein the toggling period signal synthesis circuit includes:
a first selection/transmission (selection and transmission) circuit configured to inversely buffer a ground voltage, the first preamble control signal or the second preamble control signal to output the inversely buffered signal of the ground voltage, the first preamble control signal or the second preamble control signal as a first pre-signal in response to the first selection signal and the second selection signal;
a first logic circuit configured to inversely buffer the normal control signal in response to the ground voltage to output the inversely buffered signal of the normal control signal as a first normal signal;
a second selection/transmission circuit configured to inversely buffer the ground voltage, the first postamble control signal or the second postamble control signal to output the inversely buffered signal of the ground voltage, the first postamble control signal or the second postamble control signal as a first post-signal in response to the third selection signal and the fourth selection signal; and a second logic circuit configured to perform a logical NAND operation of the first pre-signal, the first normal signal and the first post-signal to generate the toggling period signal.

10. The semiconductor device of claim 8, wherein the down period signal synthesis circuit includes:
a third logic circuit configured to perform a logical NOR operation of the first preamble control signal and the second preamble control signal to generate a second pre-signal;
a fourth logic circuit configured to perform a logical NOR operation of the pre-period signal and the normal control signal to generate a second normal-signal;
a third selection/transmission circuit configured to inversely buffer a ground voltage, the first postamble control signal or the second postamble control signal to output the inversely buffered signal of the ground voltage, the first postamble control signal or the second postamble control signal as a second post-signal in response to the fifth selection signal and the sixth selection signal; and
a fifth logic circuit configured to perform a logical NAND operation of the second pre-signal, the second normal signal and the second post-signal to generate the down period signal.

11. The semiconductor device of claim 1, wherein the strobe signal generation circuit includes:
an up/down (up and down) signal generation circuit configured to be synchronized with the first and second multiplication clock signals and third and fourth multiplication clock signals to generate an up-signal in response to the first and second toggling drive signals and the first and second down drive signals and configured to be synchronized with the first to fourth multiplication clock signals to generate a down-signal in response to the first and second toggling drive signals and the first and second down drive signals; and
a drive circuit configured to drive the strobe signal according to logic levels of the up-signal and the down-signal in response to a rising output signal and a falling output signal.

12. The semiconductor device of claim 11, wherein the up/down signal generation circuit includes:
a trigger input signal generation circuit configured to generate a first trigger input signal in response to the first toggling drive signal and the first down drive signal and configured to generate a second trigger input signal in response to the second toggling drive signal and the second down drive signal;
a trigger circuit configured to be synchronized with the first to fourth multiplication clock signals to generate a pre-pull up signal in response to the first trigger input signal, the second trigger input signal and a ground voltage and configured to be synchronized with the first to fourth multiplication clock signals to generate a pre-pull down signal in response to the first trigger input signal, the second trigger input signal and the ground voltage; and
an up/down signal output circuit configured to inversely buffer the pre-pull up signal in response to a read enablement signal to output the inversely buffered signal of the pre-pull up signal as the up-signal and configured to inversely buffer the pre-pull down signal in response to the read enablement signal to output the inversely buffered signal of the pre-pull down signal as the down-signal.

13. The semiconductor device of claim 11, wherein the drive circuit includes:
a pull-up signal generation circuit configured to inversely buffer the up-signal in response to the rising output signal to generate a pull-up signal;
a pull-down signal generation circuit configured to inversely buffer the down-signal in response to the falling output signal to generate a pull-down signal; and
an internal drive circuit configured to pull up an output node in response to the pull-up signal to output a signal of the pulled-up output node as the strobe signal or configured to pull down the output node in response to the pull-down signal to output a signal of the pulled-down output node as the strobe signal.

14. A semiconductor device comprising:
a synchronization circuit configured to be synchronized with a first multiplication clock signal and a second multiplication clock signal to generate a first toggling drive signal and a second toggling drive signal from a toggling period signal and configured to be synchronized with the first and second multiplication clock signals to generate a first down drive signal and a second down drive signal from a down period signal;
a strobe signal generation circuit configured to set a postamble period and a normal period in response to the first and second toggling drive signals and the first and second down drive signals and configured to generate a strobe signal which is toggled during the normal period; and
a data output circuit configured to be synchronized with the strobe signal during the normal period to output input data as output data.

15. The semiconductor device of claim 14,
wherein the synchronization circuit is synchronized with a rising edge of the first multiplication clock signal to output the toggling period signal as the first toggling drive signal and to output the down period signal as the first down drive signal; and
wherein the synchronization circuit is synchronized with a rising edge of the second multiplication clock signal to output the toggling period signal as the second toggling drive signal and to output the down period signal as the second down drive signal.

16. The semiconductor device of claim 14,
wherein the strobe signal generation circuit is configured to set a preamble period in response to the first and second toggling drive signals and the first and second down drive signals,
wherein the number "2M" of patterns of the strobe signal is set according to the operation codes during the preamble period (where, "M" denotes a natural number), and
wherein the number "2N" of patterns of the strobe signal is set according to the operation codes during the postamble period (where, "N" denotes a natural number).

17. The semiconductor device of claim 14,
wherein the strobe signal generation circuit is configured to set a preamble period in response to the first and second toggling drive signals and the first and second down drive signals, and
wherein each of the preamble period and the postamble period is set to include at least one of a toggling period and a fixed period of the strobe signal.

18. The semiconductor device of claim 14, wherein the strobe signal generation circuit includes:
- an up/down (up and down) signal generation circuit configured to be synchronized with the first and second multiplication clock signals and third and fourth multiplication clock signals to generate an up-signal in response to the first and second toggling drive signals and the first and second down drive signals and configured to be synchronized with the first to fourth multiplication clock signals to generate a down-signal in response to the first and second toggling drive signals and the first and second down drive signals; and
- a drive circuit configured to drive the strobe signal according to logic levels of the up-signal and the down-signal in response to a rising output signal and a falling output signal.

19. The semiconductor device of claim 18, wherein the up/down signal generation circuit includes:
- a trigger input signal generation circuit configured to generate a first trigger input signal in response to the first toggling drive signal and the first down drive signal and configured to generate a second trigger input signal in response to the second toggling drive signal and the second down drive signal;
- a trigger circuit configured to be synchronized with the first to fourth multiplication clock signals to generate a pre-pull up signal in response to the first trigger input signal, the second trigger input signal and a ground voltage and configured to be synchronized with the first to fourth multiplication clock signals to generate a pre-pull down signal in response to the first trigger input signal, the second trigger input signal and the ground voltage; and
- an up/down signal output circuit configured to inversely buffer the pre-pull up signal in response to a read enablement signal to output the inversely buffered signal of the pre-pull up signal PUP as the up-signal and configured to inversely buffer the pre-pull down signal in response to the read enablement signal to output the inversely buffered signal of the pre-pull down signal as the down-signal.

20. The semiconductor device of claim 18, wherein the drive circuit includes:
- a pull-up signal generation circuit configured to inversely buffer the up-signal in response to the rising output signal to generate a pull-up signal;
- a pull-down signal generation circuit configured to inversely buffer the down-signal in response to the falling output signal to generate a pull-down signal; and
- an internal drive circuit configured to pull up an output node in response to the pull-up signal to output a signal of the pulled-up output node as the strobe signal or configured to pull down the output node in response to the pull-down signal to output a signal of the pulled-down output node as the strobe signal.

21. The semiconductor device of claim 14, further comprising:
- a frequency multiplication circuit configured to multiply a frequency of an external clock signal by two or more to generate the first and second multiplication clock signals and third and fourth multiplication clock signals that have different phases; and
- a period signal generation circuit configured to generate the toggling period signal and the down period signal whose enablement periods are controlled according to operation codes in response to a pre-strobe signal, a read pre-signal and a read post signal, wherein the strobe signal generation circuit is configured to set a preamble period in response to the first and second toggling drive signals and the first and second down drive signals.

22. A semiconductor device comprising:
- a drive signal generation circuit configured to generate a toggling drive signal and a down drive signal whose enablement periods are controlled according to operation codes; and
- a strobe signal generation circuit configured to generate a strobe signal which is toggled in synchronization with a multiplication clock signal during the enablement periods of the toggling drive signal and the down drive signal, wherein a postamble period is set according to the toggling drive signal and the down drive signal, and wherein patterns of the strobe signal are generated in various patterns in the postamble period.

23. The semiconductor device of claim 22, wherein a preamble period is set according to the toggling drive signal and the down drive signal, wherein patterns of the strobe signal are generated in the preamble period, wherein the number "2M" of patterns of the strobe signal is set according to the operation codes during the preamble period (where, "M" denotes a natural number), and wherein the number "2N" of patterns of the strobe signal is set according to the operation codes during the postamble period (where, "N" denotes a natural number).

24. The semiconductor device of claim 22, wherein the multiplication clock signal includes a first multiplication clock signal and a second multiplication clock signal, wherein the toggling drive signal includes a first toggling drive signal and a second toggling drive signal, wherein the down drive signal includes a first down drive signal and a second down drive signal, wherein the drive signal generation circuit includes:
- a period signal generation circuit configured to generate a toggling period signal and a down period signal whose enablement periods are controlled according to the operation codes in response to a pre-strobe signal, a read pre-signal and a read post signal; and
- a synchronization circuit configured to be synchronized with the first and second multiplication clock signals to generate the first and second toggling drive signals from the toggling period signal and configured to be synchronized with the first and second multiplication clock signals to generate the first and second down drive signals from the down period signal, and wherein a preamble period is set according to the toggling drive signal and the down drive signal, wherein patterns of the strobe signal are generated in the preamble period.

25. The semiconductor device of claim 24, wherein the period signal generation circuit includes:
- a control signal generation circuit configured to be synchronized with the first and second multiplication clock signals to generate a pre-period signal, a first preamble control signal, a second preamble control signal, a normal control signal, a first postamble control signal and a second postamble control signal in response to the pre-strobe signal, the read pre-signal and the read post-signal; and a period signal output circuit configured to synthesize the pre-period signal, the first and second preamble control signals, and the first and second postamble control signals to generate the toggling period signal and the down period signal according to a logic level combination of the operation codes.

26. The semiconductor device of claim 25, wherein the control signal generation circuit includes:
a pre-period signal generation circuit configured to be synchronized with the first multiplication clock signal to generate the pre-period signal which is enabled in response to the pre-strobe signal; and
a toggling control signal generation circuit configured to be synchronized with the first and second multiplication clock signals to generate the first and second preamble control signals, a third preamble control signal, the normal control signal, and the first and second postamble control signals in response to the read pre-signal and the read post-signal.

27. The semiconductor device of claim 26, wherein the toggling control signal generation circuit includes:
a preamble control signal generation circuit configured to be synchronized with the first and second multiplication clock signals to generate the first to third preamble control signals which are sequentially enabled in response to the read pre-signal;
a normal control signal generation circuit configured to be synchronized with the first and second multiplication clock signals to generate the normal control signal which is enabled if the third preamble control signal is enabled; and
a postamble control signal generation circuit configured to be synchronized with the first and second multiplication clock signals to generate the first and second postamble control signals which are sequentially enabled in response to the read post-signal.

28. The semiconductor device of claim 25, wherein the period signal output circuit includes:
a selection signal generation circuit configured to generate first to sixth selection signals which are selectively enabled according to a logic level combination of the operation codes;
a toggling period signal synthesis circuit configured to synthesize the normal control signal, the first and second preamble control signals, and the first and second postamble control signals to output the synthesized signal as the toggling period signal in response to the first to fourth selection signals; and
a down period signal synthesis circuit configured to synthesize the normal control signal, the pre-period signal, the first and second preamble control signals, and the first and second postamble control signals to generate the down period signal in response to the fifth and sixth selection signals.

29. The semiconductor device of claim 28, wherein the toggling period signal synthesis circuit includes:
a first selection/transmission circuit configured to inversely buffer a ground voltage, the first preamble control signal or the second preamble control signal to output the inversely buffered signal of the ground voltage, the first preamble control signal or the second preamble control signal as a first pre-signal in response to the first selection signal and the second selection signal;
a first logic circuit configured to inversely buffer the normal control signal in response to the ground voltage to output the inversely buffered signal of the normal control signal as a first normal signal;
a second selection/transmission circuit configured to inversely buffer the ground voltage, the first postamble control signal or the second postamble control signal to output the inversely buffered signal of the ground voltage, the first postamble control signal or the second postamble control signal as a first post-signal in response to the third selection signal and the fourth selection signal; and
a second logic circuit configured to perform a logical NAND operation of the first pre-signal, the first normal signal and the first post-signal to generate the toggling period signal.

30. The semiconductor device of claim 28, wherein the down period signal synthesis circuit includes:
a third logic circuit configured to perform a logical NOR operation of the first preamble control signal and the second preamble control signal to generate a second pre-signal;
a fourth logic circuit configured to perform a logical NOR operation of the pre-period signal and the normal control signal to generate a second normal-signal;
a third selection/transmission circuit configured to inversely buffer a ground voltage, the first postamble control signal or the second postamble control signal to output the inversely buffered signal of the ground voltage, the first postamble control signal or the second postamble control signal as a second post-signal in response to the fifth selection signal and the sixth selection signal; and
a fifth logic circuit configured to perform a logical NAND operation of the second pre-signal, the second normal signal and the second post-signal to generate the down period signal.

31. The semiconductor device of claim 22,
wherein the multiplication clock signal includes first to fourth multiplication clock signals; and
wherein the strobe signal generation circuit includes:
an up/down (up and down) signal generation circuit configured to be synchronized with the first to fourth multiplication clock signals to generate an up-signal in response to the first and second toggling drive signals and the first and second down drive signals and configured to be synchronized with the first to fourth multiplication clock signals to generate a down-signal in response to the first and second toggling drive signals and the first and second down drive signals; and
a drive circuit configured to drive the strobe signal according to logic levels of the up-signal and the down-signal in response to a rising output signal and a falling output signal.

32. The semiconductor device of claim 31, wherein the up/down signal generation circuit includes:
a trigger input signal generation circuit configured to generate a first trigger input signal in response to the first toggling drive signal and the first down drive signal and configured to generate a second trigger input signal in response to the second toggling drive signal and the second down drive signal;
a trigger circuit configured to be synchronized with the first to fourth multiplication clock signals to generate a pre-pull up signal in response to the first trigger input signal, the second trigger input signal and a ground voltage and configured to be synchronized with the first to fourth multiplication clock signals to generate a pre-pull down signal in response to the first trigger input signal, the second trigger input signal and the ground voltage; and an up/down signal output circuit configured to inversely buffer the pre-pull up signal in response to a read enablement signal to output the inversely buffered signal of the pre-pull up signal as the up-signal and configured to inversely buffer the pre-pull down signal in response to the read enablement signal to output the inversely buffered signal of the pre-pull down signal as the down-signal.

33. The semiconductor device of claim 31, wherein the drive circuit includes:

a pull-up signal generation circuit configured to inversely buffer the up-signal in response to the rising output signal to generate a pull-up signal;

a pull-down signal generation circuit configured to inversely buffer the down-signal in response to the falling output signal to generate a pull-down signal; and an internal drive circuit configured to pull up an output node in response to the pull-up signal to output a signal of the pulled-up output node as the strobe signal or configured to pull down the output node in response to the pull-down signal to output a signal of the pulled-down output node as the strobe signal.

34. A semiconductor device comprising:

a drive signal generation circuit configured to generate a toggling drive signal and a down drive signal whose enablement periods are controlled according to operation codes; and a strobe signal generation circuit configured to generate a strobe signal which is toggled in synchronization with a multiplication clock signal during the enablement periods of the toggling drive signal and the down drive signal, wherein the strobe signal is toggled or fixed to have a predetermined level during the enablement periods of the toggling drive signal and the down drive signal; and wherein patterns of the strobe signal are generated in various patterns in a postable period.

35. The semiconductor device of claim 34, wherein the strobe signal generation circuit sets patterns of the strobe signal during the postamble period.

36. The semiconductor device of claim 35, wherein the postamble period is set to include at least one of a toggling period and a fixed period of the strobe signal.

37. The semiconductor device of claim 34, wherein the strobe signal generation circuit sets patterns of the strobe signal during a preamble period and a normal period.

38. The semiconductor device of claim 37, wherein the preamble period is set to include at least one of a toggling period and a fixed period of the strobe signal.

39. A semiconductor device comprising:

a strobe signal generation circuit configured to set a postamble period and a normal period in response to first and second toggling drive signals and first and second down drive signals and configured to generate a strobe signal which is toggled during the normal period, wherein the postamble period of the strobe signal is set based on the read post signal; and wherein patterns of the strobe signal are generated in various patterns in the postamble period.

40. The semiconductor device of claim 39, wherein the strobe signal generation circuit includes:

an up/down (up and down) signal generation circuit configured to be synchronized with first and second multiplication clock signals and third and fourth multiplication clock signals to generate an up-signal in response to the first and second toggling drive signals and the first and second down drive signals and configured to be synchronized with the first to fourth multiplication clock signals to generate a down-signal in response to the first and second toggling drive signals and the first and second down drive signals; and a drive circuit configured to drive the strobe signal according to logic levels of the up-signal and the down-signal in response to a rising output signal and a falling output signal.

41. The semiconductor device of claim 40, wherein the up/down signal generation circuit includes:

a trigger input signal generation circuit configured to generate a first trigger input signal in response to the first toggling drive signal and the first down drive signal and configured to generate a second trigger input signal in response to the second toggling drive signal and the second down drive signal;

a trigger circuit configured to be synchronized with the first to fourth multiplication clock signals to generate a pre-pull up signal in response to the first trigger input signal, the second trigger input signal and a ground voltage and configured to be synchronized with the first to fourth multiplication clock signals to generate a pre-pull down signal in response to the first trigger input signal, the second trigger input signal and the ground voltage; and an up/down signal output circuit configured to inversely buffer the pre-pull up signal in response to a read enablement signal to output the inversely buffered signal of the pre-pull up signal as the up-signal and configured to inversely buffer the pre-pull down signal in response to the read enablement signal to output the inversely buffered signal of the pre-pull down signal as the down-signal.

42. The semiconductor device of claim 40, wherein the drive circuit includes:

a pull-up signal generation circuit configured to inversely buffer the up-signal in response to the rising output signal to generate a pull-up signal;

a pull-down signal generation circuit configured to inversely buffer the down-signal in response to the falling output signal to generate a pull-down signal; and an internal drive circuit configured to pull up an output node in response to the pull-up signal to output a signal of the pulled-up output node as the strobe signal or configured to pull down the output node in response to the pull-down signal to output a signal of the pulled-down output node as the strobe signal.

* * * * *